United States Patent
Tsunoda

(10) Patent No.: US 9,852,884 B2
(45) Date of Patent: Dec. 26, 2017

(54) INFORMATION PROCESSING APPARATUS, INFORMATION PROCESSING METHOD, AND STORAGE MEDIUM

(71) Applicant: NIPPON CONTROL SYSTEM CORPORATION, Tokyo (JP)

(72) Inventor: Dai Tsunoda, Kanagawa (JP)

(73) Assignee: Nippon Control System Corporation, Tokyo (JP)

( * ) Notice: Subject to any disclaimer, the term of this patent is extended or adjusted under 35 U.S.C. 154(b) by 0 days.

(21) Appl. No.: 15/128,713

(22) PCT Filed: Feb. 6, 2015

(86) PCT No.: PCT/JP2015/053365
§ 371 (c)(1),
(2) Date: Sep. 23, 2016

(87) PCT Pub. No.: WO2015/146313
PCT Pub. Date: Oct. 1, 2015

(65) Prior Publication Data
US 2017/0125212 A1   May 4, 2017

(30) Foreign Application Priority Data
Mar. 28, 2014   (JP) .................. 2014-069348

(51) Int. Cl.
*H01J 37/302* (2006.01)
*G03F 1/20* (2012.01)
(Continued)

(52) U.S. Cl.
CPC ......... *H01J 37/3026* (2013.01); *G03F 1/20* (2013.01); *G03F 1/84* (2013.01); *G03F 7/20* (2013.01);
(Continued)

(58) Field of Classification Search
CPC ..... H01J 37/3026; H01J 37/3175; G03F 1/20; G03F 1/84; G03F 7/2037; G06T 7/13
See application file for complete search history.

(56) References Cited

U.S. PATENT DOCUMENTS

| 6,724,507 B1 * | 4/2004 | Ikegami ............... H04N 1/6058 |
| | | 358/501 |
| 2009/0028397 A1 | 1/2009 | Makram-Ebeid |

(Continued)

FOREIGN PATENT DOCUMENTS

| JP | 10-261562 A | 9/1998 |
| JP | 2000-114169 A | 4/2000 |

(Continued)

OTHER PUBLICATIONS

International Search Report issued in corresponding International Patent Application No. PCT/JP2015/053365, dated May 12, 2015; 7 pages with English translation.
(Continued)

*Primary Examiner* — Edward Park
(74) *Attorney, Agent, or Firm* — McDermott Will & Emery LLP

(57) ABSTRACT

In order to solve the problem that information indicating three or more points on a contour of a figure drawn by an electron beam writer cannot be more precisely acquired, an information processing apparatus includes: an accepting unit that accepts pattern information indicating a pattern figure, and actually observed contour information acquired using an image obtained by capturing an image of a figure drawn by an electron beam writer; a transforming information acquiring unit that acquires transforming information, which is information that minimizes the sum of squares of differences between convolution values corresponding to three or more corrected contour points of a given point spread function in a region indicated by the pattern figure indicated by the
(Continued)

pattern information and a threshold regarding the convolution values; a corrected contour point acquiring unit that acquires corrected contour point information, which is information indicating three or more corrected contour points respectively corresponding to three or more actually observed contour points, using the transforming information; and an output unit that outputs the corrected contour point information. Accordingly, it is possible to more precisely acquire information indicating three or more points on a contour of a figure drawn by an electron beam writer.

15 Claims, 22 Drawing Sheets

(51) Int. Cl.
    *G03F 1/84*     (2012.01)
    *G03F 7/20*     (2006.01)
    *H01J 37/317*     (2006.01)
    *G06T 7/13*     (2017.01)

(52) U.S. Cl.
    CPC .............. *G03F 7/2037* (2013.01); *G06T 7/13* (2017.01); *H01J 37/3174* (2013.01); *H01J 37/3175* (2013.01)

(56) References Cited

U.S. PATENT DOCUMENTS

| | | |
|---|---|---|
| 2011/0202893 A1 | 8/2011 | Kusnadi et al. |
| 2012/0162454 A1* | 6/2012 | Park ....................... H04N 5/145 348/208.6 |
| 2013/0202893 A1 | 8/2013 | Rihan et al. |
| 2014/0003703 A1 | 1/2014 | Shibahara et al. |
| 2015/0146966 A1* | 5/2015 | Weisbuch ................. G06T 5/50 382/145 |
| 2015/0212019 A1 | 7/2015 | Shishido et al. |

FOREIGN PATENT DOCUMENTS

| | | |
|---|---|---|
| JP | 2006-107209 A | 4/2006 |
| WO | 2006/048793 A1 | 5/2006 |
| WO | 2013/179956 A1 | 12/2013 |

OTHER PUBLICATIONS

"NDE-MDP", Nippon Control System Corporation, accessed on Mar. 12, 2014, http://www.nippon-control-system.co.p/catalog/NDE-MS.pdf, with English language translation, 28 pages.
Notification of Reasons for Refusal issued in corresponding Japanese Patent Application No. 2014-069348, dated Jul. 8, 2017; with English translation.
European Search Report dated in corresponding European Patent Application No. 15769775.6, dated Nov. 2, 2017.

* cited by examiner

| ID | x | y |
|---|---|---|
| 001 | 50 | 10 |
| 002 | 51 | 10 |
| 003 | 52 | 9 |
| 004 | 53 | 10 |
| 005 | 54 | 11 |
| 006 | 55 | 12 |
| 007 | 56 | 12 |
| 008 | 57 | 11 |
| 009 | 58 | 10 |
| 010 | 59 | 9 |
| . | . | . |
| . | . | . |
| . | . | . |

FIG.9

| ID | x | y |
|---|---|---|
| 001 | 48 | 12 |
| 002 | 49 | 13 |
| 003 | 50 | 13 |
| 004 | 51 | 12 |
| 005 | 52 | 11 |
| 006 | 53 | 10 |
| 007 | 54 | 9 |
| 008 | 55 | 9 |
| 009 | 56 | 10 |
| 010 | 57 | 11 |
| . | . | . |
| . | . | . |
| . | . | . |

FIG.10

| ID  | x  | y  | r  | b  |
|-----|----|----|----|----|
| 001 | 48 | 12 | 0  | 3  |
| 002 | 49 | 13 | 1  | 6  |
| 003 | 50 | 13 | 2  | 4  |
| 004 | 51 | 12 | 3  | 2  |
| 005 | 52 | 11 | 4  | 1  |
| 006 | 53 | 10 | 6  | 5  |
| 007 | 54 | 9  | 8  | 2  |
| 008 | 55 | 9  | 9  | 3  |
| 009 | 56 | 10 | 11 | 2  |
| 010 | 57 | 11 | 13 | -2 |
| ... | ...| ...| ...| ...|

FIG.12

| ID | r | x | y | b |
|---|---|---|---|---|
| 001 | 0 | 50 | 10 | 8 |
| 002 | 2 | 52 | 10 | 8 |
| 003 | 4 | 54 | 10 | 8 |
| 004 | 6 | 56 | 10 | 6 |
| 005 | 8 | 58 | 10 | 6 |
| 006 | 10 | 60 | 10 | 6 |
| 007 | 12 | 62 | 11 | 4 |
| 008 | 14 | 64 | 11 | 4 |
| 009 | 16 | 66 | 12 | 0 |
| 010 | 18 | 68 | 12 | −2 |
| . | . | . | . | . |

FIG.17

| ID | x | y |
|---|---|---|
| 001 | 50 | 18 |
| 002 | 52 | 18 |
| 003 | 54 | 18 |
| 004 | 56 | 16 |
| 005 | 58 | 16 |
| 006 | 60 | 16 |
| 007 | 62 | 15 |
| 008 | 64 | 15 |
| 009 | 66 | 12 |
| 010 | 68 | 10 |
| . | . | . |
| . | . | . |
| . | . | . |

FIG.18

INFORMATION PROCESSING APPARATUS, INFORMATION PROCESSING METHOD, AND STORAGE MEDIUM

CROSS-REFERENCE TO RELATED APPLICATION

This application is the U.S. National Phase under 35 U.S.C. §371 of International Patent Application No. PCT/JP2015/053365, filed on Feb. 6, 2015, which in turn claims the benefit and priority from Japanese Patent Application Number 2014-069348, filed Mar. 28, 2014 the subject matters of which are hereby incorporated by reference.

TECHNICAL FIELD

The present invention relates to an information processing apparatus and the like for outputting information indicating three or more points on a contour of a figure drawn by an electron beam writer.

BACKGROUND ART

In processing for producing photomasks, there is an MPC process (mask process correction) (see Non-Patent Document 1). As an approach for this process, there is a contour based calibration approach (see Patent Document 1).

CITATION LIST

Patent Document

Patent Document 1: U.S. Patent Application Publication No. 2011/0202893

Non-Patent Document

Non-Patent Document 1: "NDE-MDP", [online], Nippon Control System Corporation, [accessed on Mar. 12, 2014], Internet address [URL: http://www.nippon-control-system.co.jp/catalog/NDE-MS.pdf]

SUMMARY OF INVENTION

Technical Problem

Conventionally, it is not possible to more precisely acquire information indicating three or more points on a contour of a figure drawn by an electron beam writer, the information being for use in contour based calibration.

Solution to Problem

A first aspect of the present invention is directed to an information processing apparatus including: an accepting unit that accepts pattern information, which is information indicating a pattern figure that is a figure that is to be drawn by an electron beam writer, and actually observed contour information, which is information acquired using an image obtained by capturing an image of a figure drawn according to the pattern figure by the electron beam writer, and indicating an actually observed contour that is a contour of the figure; a transforming information acquiring unit that acquires, using the pattern information and the actually observed contour information, transforming information, which is information for correcting three or more actually observed contour points that are points on the actually observed contour respectively into three or more corrected contour points that are points obtained by correcting the three or more actually observed points, and is information that minimizes the sum of squares of differences between convolution values corresponding to the three or more corrected contour points of a given point spread function in a region indicated by the pattern figure and a threshold regarding the convolution values; a corrected contour point acquiring unit that acquires the three or more corrected contour points respectively corresponding to the three or more actually observed contour points, using the actually observed contour information and the transforming information, and acquires corrected contour point information, which is information indicating the acquired three or more corrected contour points; and an output unit that outputs the corrected contour point information.

With this configuration, it is possible to more precisely acquire information indicating three or more points on a contour of a figure drawn by an electron beam writer.

Advantageous Effects of Invention

With an information processing apparatus and the like according to the present invention, it is possible to more precisely acquire information indicating three or more points on a contour of a figure drawn by an electron beam writer.

BRIEF DESCRIPTION OF DRAWINGS

FIG. 9 is a table showing an example of actually observed contour information in the embodiment.

FIG. 10 is a table showing an example of corrected contour point information in the embodiment.

FIG. 12 is a table showing path lengths to target points and distances to corrected contour points in the embodiment.

FIG. 17 is a table showing path lengths to target points and distances to ideal contour points in the embodiment.

FIG. 18 is a table showing an example of ideal contour point information in the embodiment.

DESCRIPTION OF EMBODIMENT

Figure 1:
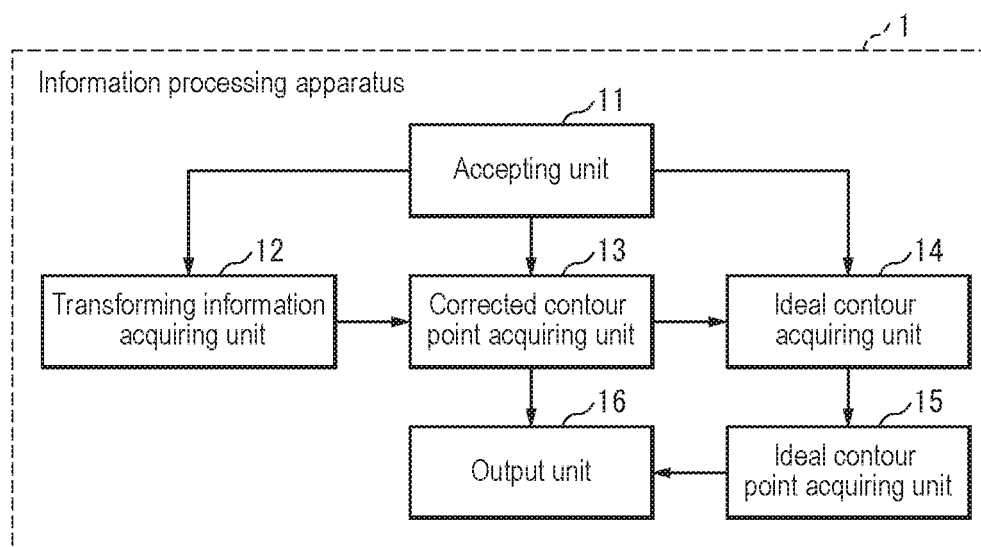
FIG. 1 is a block diagram of an information processing apparatus 1 in Embodiment 1.

Hereinafter, an embodiment of an information processing apparatus and the like according to the present invention will be described with reference to the drawings. It should be noted that constituent elements denoted by the same reference numerals in the embodiment perform similar operations, and thus a description thereof may not be repeated. The formats, the content, and the like of each piece of information described in the embodiment are merely an example, and there is no limitation on the formats, the content, and the like, as long as the meaning of each piece of information can be represented.

Embodiment 1

In this embodiment, an information processing apparatus 1 for outputting information indicating three or more points on a contour of a figure drawn by an electron beam writer will be described.

FIG. 1 is a block diagram of the information processing apparatus 1 in this embodiment. The information processing apparatus 1 includes an accepting unit 11, a transforming information acquiring unit 12, a corrected contour point acquiring unit 13, an ideal contour acquiring unit 14, an ideal contour point acquiring unit 15, and an output unit 16.

The accepting unit 11 accepts pattern information, actually observed contour information, drawn figure contour point information, reference contour information, and the like. Hereinafter, these pieces of information will be sequentially described. In this example, a figure drawn according to a pattern figure by an electron beam writer will be hereinafter referred to as, where appropriate, a drawn figure. Also, an image obtained by capturing an image of such a drawn figure will be hereinafter referred to as a captured image. A drawn figure in a captured image will be hereinafter referred to as, where appropriate, a captured drawn figure. A figure obtained by simulating a figure that is drawn according to a pattern figure by an electron beam writer will be hereinafter referred to as, where appropriate, a simulated figure. The pattern figure is a figure that is to be drawn by an electron beam writer. The captured image is acquired (an image of the drawn figure is captured) typically by a SEM (scanning electron microscope).

The pattern information is information indicating a pattern figure. The pattern information is, for example, data called layout data, pattern data, or the like. There is no limitation on the data format of the pattern information. The data format of the pattern information is typically a data format called mask design data, layout design data, or the like. A specific data format of the pattern information is, for example, GDS-2, OASIS, MEBES, or the like. Note that the pattern information typically indicates one pattern figure.

Furthermore, the actually observed contour information is information indicating an actually observed contour. The actually observed contour is a contour of a captured drawn figure. The actually observed contour information is information having coordinates of three or more points forming an actually observed contour. The three or more points are typically all points forming an actually observed contour. The three or more points may be, for example, points on an actually observed contour sampled to a level at which the actually observed contour can be formed. The points forming an actually observed contour will be hereinafter referred to as, where appropriate, actually observed contour points. The actually observed contour points may be referred to as points on an actually observed contour. The contour of a captured drawn figure is, for example, represented by pixels forming a captured image. In other words, the points forming a contour of a captured drawn figure are typically represented by pixels forming a captured image. Accordingly, three or more sets of coordinates contained in the actually observed contour information are typically coordinates of these pixels. The three or more sets of coordinates contained in the actually observed contour information are typically represented by integers. The method, the procedure, and the like for acquiring the actually observed contour information are known, and thus a detailed description thereof has been omitted.

Furthermore, the drawn figure contour point information is information indicating three or more drawn figure contour points. The drawn figure contour points are points forming a drawn figure contour. The drawn figure contour is a contour of a drawn figure. The drawn figure contour points may be referred to as points on a drawn figure contour. The drawn figure contour points are typically points on a contour of a drawn figure having the level of accuracy at which correction is not required. The correction is, for example, a correction regarding displacement, size, deformation, or the like. The correction is, for example, coordinate transformation (linear transformation). That is to say, the drawn figure contour points are, for example, corrected contour points. The corrected contour points are actually observed contour points that have been corrected. The drawn figure contour points are, for example, actually observed contour points having the level of accuracy at which correction is not required.

Furthermore, the drawn figure contour is typically a contour of a drawn figure having the level of accuracy at which correction is not required. That is to say, the drawn figure contour is, for example, a corrected contour. The corrected contour is an actually observed contour that has been corrected. The drawn figure contour is, for example, an actually observed contour having the level of accuracy at which correction is not required.

Note that actually observed contour points having the level of accuracy at which correction is not required will be hereinafter referred to as, where appropriate, accurate actually observed contour points. Also, an actually observed contour having the level of accuracy at which correction is not required will be hereinafter referred to as, where appropriate, an accurate actually observed contour. Actually observed contour points that require correction will be hereinafter referred to as, where appropriate, correction-requiring actually observed contour points. An actually observed contour that requires correction will be hereinafter referred to as, where appropriate, a correction-requiring actually observed contour. The actually observed contour indicated by the actually observed contour information accepted by the accepting unit 11 is typically a correction-requiring actually observed contour.

Furthermore, the drawn figure contour point information is information having coordinates of three or more drawn figure contour points. The three or more drawn figure contour points are any three or more drawn figure contour points among the drawn figure contour points forming a drawn figure contour. The drawn figure contour point information may have, for example, coordinates of all the three or more drawn figure contour points forming a drawn figure contour. Each set of the coordinates includes two numerical values consisting of an x coordinate and a y coordinate. The numerical values are typically integers, but may also be decimals.

Furthermore, the reference contour information is information indicating a reference contour. The reference contour is any one isoline of one or more isolines in a distribution of convolution values of a given point spread function in a region indicated by the pattern figure. Specifically, the reference contour is, for example, any one isoline of one or more isolines indicating the intensity of electron beams. The intensity is the intensity of electron beams when the electron beams are incident on the entire pattern figure (the intensity when an electron beam writer draws a figure according to the pattern figure). The reference contour information is, for example, information having coordinates of all the three or more points forming a reference contour. The reference contour information will be hereinafter referred to as, where appropriate, anchor contour information. The reference contour will be hereinafter referred to as, where appropriate, an anchor contour.

The configuration of an electron beam writer, the processing and operations performed by the electron beam writer, and the like are known, and thus a detailed description thereof has been omitted.

Furthermore, the information indicating three or more actually observed contour points will be hereinafter referred to as, where appropriate, actually observed contour point information. The three or more actually observed contour points are any three or more actually observed contour points among the actually observed contour points forming an actually observed contour. The actually observed contour point information may have, for example, coordinates of all the three or more actually observed contour points forming an actually observed contour. Each set of the coordinates includes two numerical values consisting of an x coordinate and a y coordinate. The numerical values are typically integers, but may also be decimals.

Furthermore, the information indicating a drawn figure contour will be hereinafter referred to as, where appropriate, drawn figure contour information. The drawn figure contour information is information having coordinates of three or more points forming a drawn figure contour. The three or more points are typically all points forming a drawn figure contour. The three or more points may be, for example, points on a drawn figure contour sampled to a level at which the drawn figure contour can be formed. Each of the three or more sets of coordinates contained in the drawn figure contour information includes two numerical values consisting of an x coordinate and a y coordinate. The numerical values are typically integers, but may also be decimals.

Furthermore, in this embodiment, the coordinates may be vectors. The actually observed contour information accepted by the accepting unit 11 may be, for example, actually observed contour point information. The drawn figure contour point information accepted by the accepting unit 11 may be, for example, drawn figure contour information.

The accepting unit 11 typically accepts pattern information and actually observed contour information. The accepting unit 11 may accept, for example, drawn figure contour point information and reference contour information. The accepting unit 11 may accept, for example, actually observed contour information and reference contour information.

To accept is a concept that encompasses acquiring information input from an input device such as a touch panel or a keyboard, acquiring information stored in a storage medium such as an optical disk, a magnetic disk, or a semiconductor memory, and receiving information transmitted via a wired or wireless communication line.

The accepting unit 11 may accept information, an instruction, or the like input via any part such as a menu screen, a keyboard, or the like. The accepting unit 11 may be realized by control software for a menu screen, or a device driver for an input part such as a keyboard, for example.

The transforming information acquiring unit 12 acquires transforming information. The transforming information is information for transforming the actually observed contour points into other points corresponding thereto. In other words, the transforming information is information for calculating the coordinates of other points corresponding to the actually observed contour points, using the coordinates of the actually observed contour points. The transforming information may be referred to as information for correcting the actually observed contour points (information for performing correction on the actually observed contour points). That is to say, the transforming information may be referred to as information for calculating corrected contour points, using the actually observed contour points.

Furthermore, the transforming information is typically information having one or more parameters. The information having one or more parameters is, for example, a vector. The transforming information may be, for example, a function. The function is typically a function having the vector. The transforming information that is a vector will be hereinafter referred to as, where appropriate, a transforming vector. The transforming information that is a function will be hereinafter referred to as, where appropriate, a transforming function.

Furthermore, in the description below, to acquire a point is to acquire coordinates of the point. In a similar manner, in the description below, to calculate a point is to calculate coordinates of the point. In the description below, to acquire a line is to acquire information indicating the line. In a similar manner, in the description below, to calculate a line is to calculate information indicating the line. The information indicating the line is, for example, information having coordinates of all of two or more points forming the line, a function indicating the line, or the like. To acquire typically includes performing a calculation.

The transforming information acquiring unit 12 acquires transforming information, typically using the pattern information and the actually observed contour information. In this case, the transforming information acquiring unit 12 typically acquires reference contour information together with the transforming information.

Specifically, the transforming information acquiring unit 12 calculates transforming information and a threshold that minimize the sum of squares of differences between convolution values corresponding to the three or more corrected contour points of a given point spread function in a region indicated by the pattern figure and the threshold regarding the convolution values. The threshold will be hereinafter referred to as, where appropriate, a convolution threshold. The transforming information acquiring unit 12 acquires reference contour information, using the calculated threshold. The method, the procedure, and the like for acquiring reference contour information using the threshold are known, and thus a detailed description thereof has been omitted.

It is assumed that the transforming information is a transforming vector. The transforming vector is taken as $\alpha$. The coordinates of an $i^{-th}$ actually observed contour point are taken as $x^M_i$. The convolution threshold is taken as T. A function for calculating the coordinates of a corrected contour point using the coordinates of the actually observed contour point and the transforming information is taken as M. A function for calculating a convolution value corresponding to the corrected contour point of a given point spread function in a region indicated by the pattern figure, using the coordinates of the corrected contour point, is taken as I. The transforming information acquiring unit 12 calculates, for example, α and T that minimize the value calculated from Formula 1.

$$\sum_{i=1}^{n} (I(M(x_i^M, \alpha)) - T)^2 \qquad \text{Formula 1}$$

The method for calculating α and T in Formula 1 is, for example, non-linear least squares. Non-linear least squares is, for example, the Gauss-Newton method, the Levenberg-Marquardt method, or the like. Note that function I in Formula 1 is Formula 2. Formula 2 is a function for calculating a convolution value corresponding to a point x of a given point spread function in a region pattern indicated by the pattern figure indicated by the pattern information. In Formula 2, x is the coordinates of the point x. Furthermore, r is the coordinates of the point in the region pattern.

$$I(x) = \int_{pattern} p(r-x) dr \qquad \text{Formula 2}$$

Furthermore, a function p in Formula 2 is, for example, Formula 3. Formula 3 is a function indicating scattering of electron beams (intensity distribution) at a given point, and is a point spread function (PSF). In Formula 3, u is the size (length) of a vector from the origin $(x, y) = (0, 0)$ to a point u. That is to say, u is the size of a vector from the origin to the coordinates obtained by "r–x" in Formula 2. In Formula 3, σ is a parameter indicating the degree of scattering of electron beams.

$$p(u) = \frac{1}{\sigma^2} \exp\left(-\frac{u^2}{\sigma^2}\right) \qquad \text{Formula 3}$$

If the function p is Formula 3, Formula 2 is a function for calculating the magnitude of influence (energy) on a point x when electron beams are incident on the entire region (electron beam irradiated region) pattern in the pattern figure indicated by the pattern information. The magnitude of the influence may be referred to as the intensity of the electron beams.

Furthermore, the function p may be any function, as long as it is a point spread function that satisfies all of the following conditions.

(1) The value monotonically decreases.
(2) If $x \to \infty$, $p(x)$ converges to 0.
(3) The integral of $p(r) \times r$ in interval 0 to $\infty$ converges to a certain constant.

Furthermore, the transforming information acquiring unit 12 may acquire, for example, M in Formula 1 that is a function having the calculated α, as the transforming information.

The corrected contour point acquiring unit 13 acquires corrected contour point information, using the actually observed contour information and the transforming information. The actually observed contour information is the actually observed contour information accepted by the accepting unit 11. The transforming information is the transforming information acquired by the transforming information acquiring unit 12. The transforming information may be, for example, transforming information held in advance by the corrected contour point acquiring unit 13. The transforming information acquired by the transforming information acquiring unit 12 will be hereinafter referred to as, where appropriate, acquired transforming information. The transforming information held in advance by the corrected contour point acquiring unit 13 will be hereinafter referred to as, where appropriate, held transforming information.

Furthermore, the corrected contour point acquiring unit 13 calculates three or more corrected contour points respectively corresponding to the three or more actually observed contour points. That is to say, the corrected contour point acquiring unit 13 calculates, for one actually observed contour point, one corrected contour point corresponding to that actually observed contour point, this calculation being performed for each of the three or more actually observed contour points.

For example, in the case of using the acquired transforming information, the corrected contour point acquiring unit 13 acquires, for example, coordinates of the three or more actually observed contour points used by the transforming information acquiring unit 12 to acquire the transforming information, from the actually observed contour information. The corrected contour point acquiring unit 13 applies the acquired transforming information to the coordinates of the three or more actually observed contour points, thereby calculating the coordinates of three or more corrected contour points.

If the acquired transforming information is, for example, a transforming vector, the corrected contour point acquiring unit 13 applies, for example, one or more parameters contained in the transforming vector to the coordinates of the three or more actually observed contour points, thereby calculating the coordinates of three or more corrected contour points. Note that "apply a parameter" is, for example, to perform a predetermined calculation using the parameter.

Furthermore, if the acquired transforming information is a transforming function, the corrected contour point acquiring unit 13 substitutes the coordinates of the three or more actually observed contour points into the transforming function, thereby calculating the coordinates of three or more corrected contour points. The corrected contour point acquiring unit 13 acquires corrected contour point information having the calculated coordinates of the three or more corrected contour points.

Furthermore, in the case of using the held transforming information, the corrected contour point acquiring unit 13 acquires, for example, the coordinates of three or more actually observed contour points at predetermined intervals, from the actually observed contour information. The corrected contour point acquiring unit 13 calculates coordinates of three or more corrected contour points, using the acquired coordinates of the three or more actually observed contour points and the held transforming information. The method, the procedure, and the like for calculating the coordinates of corrected contour points are as in the case of using the acquired transforming information, and thus a description thereof has been omitted. The corrected contour point acquiring unit 13 acquires corrected contour point information having the calculated coordinates of the three or more corrected contour points.

The ideal contour acquiring unit 14 acquires ideal contour information. The ideal contour information is information indicating an ideal contour. Also, the ideal contour is a curve that approximates the three or more corrected contour points. The ideal contour is, for example, a contour of a drawn figure, and may be referred to as an ideal contour not containing errors such as noise or displacement.

The ideal contour information is typically a function for calculating distances from target points on a reference contour to ideal contour points respectively corresponding to the target points, based on path lengths from a reference point to the target points. The target points are points on the reference contour (reference contour points), and are points targeted when calculating distances to the ideal contour points. The reference point is a given point on the reference contour (reference contour point), and is a point referenced when calculating path lengths to the target points. The path lengths are lengths on the reference contour. That is to say, for example, a path length from a point a on a reference contour to a point b on the reference contour is a length on the reference contour from the point a to the point b.

Furthermore, the ideal contour information may be, for example, a function for calculating the coordinates of ideal contour points. The function may be, for example, a function for calculating a y coordinate of an ideal contour point, from an x coordinate of the ideal contour point, or a function for calculating an x coordinate of an ideal contour point, from a y coordinate of the ideal contour point.

Furthermore, the ideal contour information may be, for example, information having coordinates of three or more points forming an ideal contour. The three or more points are typically all points forming an ideal contour. The three or more points may be, for example, points on the ideal contour sampled to a level at which the ideal contour can be formed. The points forming an ideal contour will be hereinafter referred to as, where appropriate, ideal contour points. The ideal contour points may be referred to as, for example, points on the ideal contour. Each set of the coordinates contained in the ideal contour information includes two numerical values consisting of an x coordinate and a y coordinate. The numerical values are typically integers, but may also be decimals.

The ideal contour acquiring unit 14 acquires ideal contour information, typically using the corrected contour point information and the reference contour information. The corrected contour point information is the corrected contour point information acquired by the corrected contour point acquiring unit 13. The reference contour information is the reference contour information acquired by the transforming information acquiring unit 12. The corrected contour point information may be, for example, the drawn figure contour point information accepted by the accepting unit 11. The reference contour information may be, for example, the reference contour information accepted by the accepting unit 11.

In this case, the ideal contour acquiring unit 14 acquires ideal contour information, which is a function for calculating distances from target points on a reference contour to ideal contour points respectively corresponding to the target points, based on path lengths from a reference point to the target points. For example, the ideal contour acquiring unit 14 first calculates distances between the three or more corrected contour points and points on a reference contour respectively corresponding to the corrected contour points. A reference contour point corresponding to each corrected contour point will be hereinafter referred to as, where appropriate, a first corresponding point. The ideal contour acquiring unit 14 calculates, as the ideal contour information, a function for calculating the distances based on path lengths from a given point on the reference contour to the first corresponding points, the function indicating a curve that approximates the distances. The processing will be hereinafter referred to as, where appropriate, smoothing processing. The ideal contour acquiring unit 14 removes any corrected contour point whose distance from the ideal contour indicated by the calculated ideal contour information is large enough to meet a predetermined condition. This processing will be hereinafter referred to as, where appropriate, outlier removing processing. To remove corrected contour points is, for example, to delete the coordinates of the corrected contour points from the corrected contour point information. The outlier removing processing is performed, for example, using a method such as the Smirnov-Grubbs test. The ideal contour acquiring unit 14 applies the smoothing processing to corrected contour points after the removal. The ideal contour acquiring unit 14 again performs outlier removing processing using the acquired ideal contour information, and repeats the smoothing processing and the outlier removing processing once or more until there is no more corrected contour point that is to be removed.

A detailed procedure of the above-described smoothing processing and the like is, for example, as follows.

(1) The ideal contour acquiring unit 14 associates the three or more corrected contour points one-to-one with first corresponding points, which are reference contour points on a reference contour.

(2) The ideal contour acquiring unit 14 calculates distances between the three or more corrected contour points and the first corresponding points.

(3) The ideal contour acquiring unit 14 calculates, as the ideal contour information, a function indicating a curve that approximates the three or more distances calculated in (2), the function being for calculating the distances based on path lengths from a given point on the reference contour to the corresponding points.

(4) The ideal contour acquiring unit 14 calculates points on an ideal contour indicated by the ideal contour information, respectively corresponding to the three or more corrected contour points, using the ideal contour information (function) calculated in (3). A point on the ideal contour corresponding to each corrected contour point will be hereinafter referred to as, where appropriate, a second corresponding point.

(5) The ideal contour acquiring unit 14 calculates distances between the three or more corrected contour points and the second corresponding points calculated in (4).

(6) The ideal contour acquiring unit 14 deletes any corrected contour point whose distance calculated in (5) is large enough to meet a predetermined condition. The ideal contour acquiring unit 14 ends the processing when there is no more corrected contour point that is to be deleted.

(7) The ideal contour acquiring unit 14 returns the procedure to (3). That is to say, the ideal contour acquiring unit 14 applies the processing in (3) to three or more corrected contour points after the deletion in (6).

In (1) above, to associate corrected contour points with first corresponding points is to associate coordinates of the corrected contour points with coordinates of the first corresponding points. There is no limitation on the method, the procedure, and the like for associating corrected contour points with reference contour points. The ideal contour acquiring unit 14 typically acquires normal lines with respect to the reference contour, at three or more points on the reference contour. The ideal contour acquiring unit 14 associates corrected contour points positioned on the normal lines with the reference contour points (first corresponding points).

The method, the procedure, and the like for calculating a curve that approximates the three or more distances in (3) above are known, and thus a detailed description thereof has been omitted.

Figure 2:
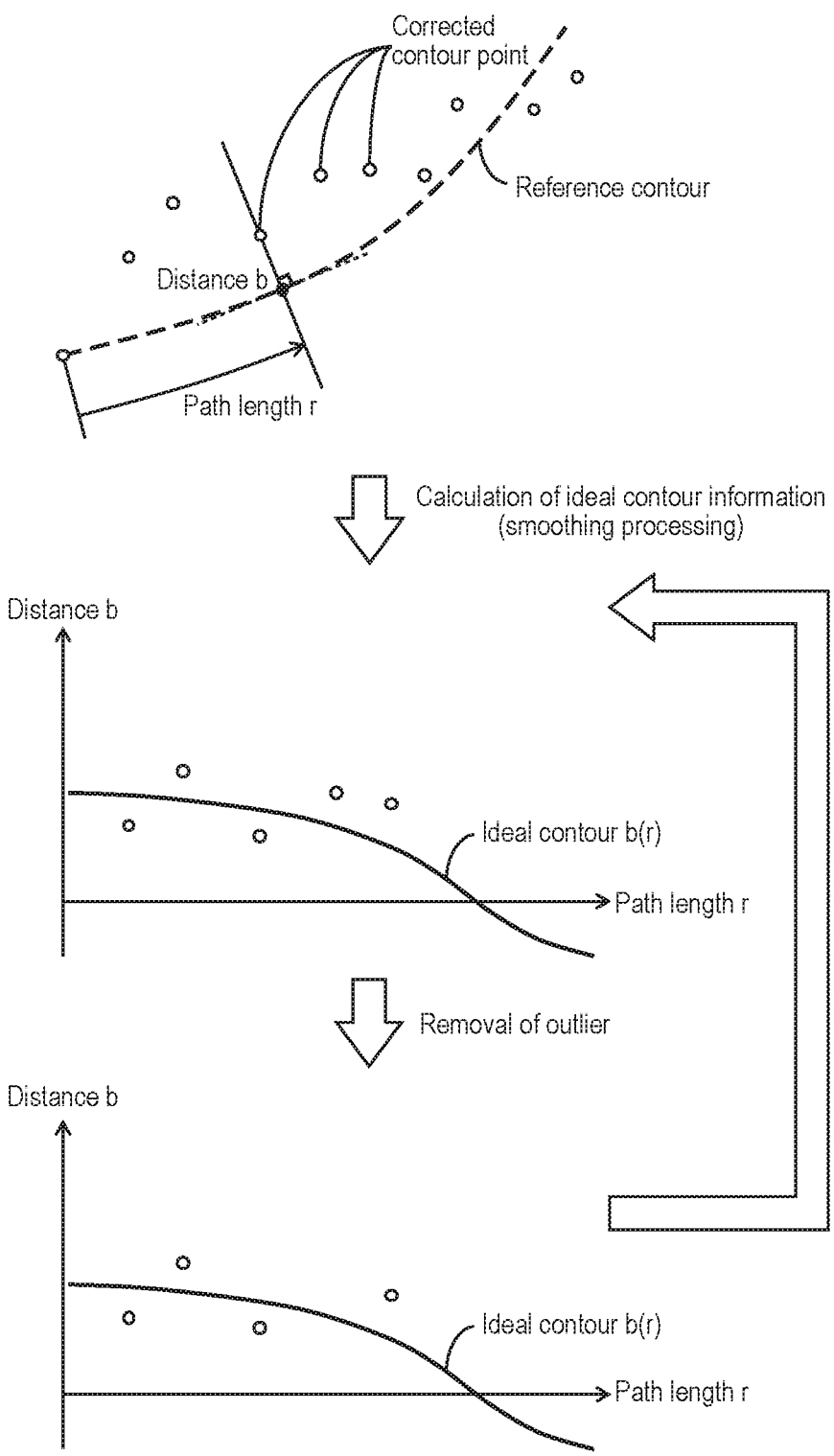
FIG. 2 is a schematic diagram of smoothing processing and outlier removing processing in the embodiment.

A schematic diagram of the above-described processing is, for example, shown in FIG. 2.

Furthermore, the ideal contour acquiring unit 14 may acquire ideal contour information, for example, using only the corrected contour point information. The corrected contour point information is the corrected contour point information acquired by the corrected contour point acquiring unit 13. The corrected contour point information may be, for example, the drawn figure contour point information accepted by the accepting unit 11.

In this case, the ideal contour acquiring unit 14 acquires, for example, ideal contour information that is a function for calculating the coordinates of ideal contour points, or ideal contour information having coordinates of all the three or more ideal contour points forming an ideal contour.

In the case of calculating ideal contour information that is a function for calculating the coordinates of ideal contour points, the ideal contour acquiring unit 14 calculates, for example, for every successive n corrected contour points, three or more functions indicating a straight line or a curve that approximates the n corrected contour points. It is preferable that n is two or more and smaller than the number of coordinates of the corrected contour points contained in the corrected contour point information. At this time, the ideal contour acquiring unit 14 calculates, for example, a function that passes through two corrected contour points at both ends. The method, the procedure, and the like for calculating functions that indicate straight lines or curves are known, and thus a detailed description thereof has been omitted. The ideal contour acquiring unit 14 associates domains or ranges indicated by the coordinates of the corrected contour points used in the calculation, respectively with the three or more functions. Typically, domains are preferable. The ideal contour acquiring unit 14 acquires ideal contour information, which is three or more functions associated with the three or more domains or ranges.

Furthermore, in the case of calculating ideal contour information having coordinates of all the three or more ideal contour points forming an ideal contour, the ideal contour acquiring unit 14 calculates, for example, three or more functions associated with the domains or ranges, as described above. The ideal contour acquiring unit 14 calculates, using the calculated three or more functions, coordinates of three or more points forming straight lines or curves indicated by the functions, the coordinates being within the associated domains or ranges. The ideal contour acquiring unit 14 acquires ideal contour information having coordinates of all the three or more ideal contour points forming an ideal contour.

There is no limitation on the method, the procedure, and the like for acquiring ideal contour information, using only the corrected contour point information. That is to say, the ideal contour acquiring unit 14 may acquire ideal contour information, for example, using only the corrected contour point information, according to methods other than that described above.

The ideal contour point acquiring unit 15 acquires ideal contour point information. The ideal contour point information is information indicating three or more ideal contour points. The ideal contour point information is information having coordinates of three or more ideal contour points. The three or more ideal contour points are any three or more ideal contour points among the ideal contour points forming an ideal contour. The ideal contour point information may have, for example, coordinates of all the three or more ideal contour points forming an ideal contour. Each set of the coordinates includes two numerical values consisting of an x coordinate and a y coordinate. The numerical values are typically integers, but may also be decimals.

The ideal contour point acquiring unit 15 acquires ideal contour point information, typically using the ideal contour information and the reference contour information. The ideal contour information is the ideal contour information acquired by the ideal contour acquiring unit 14. The ideal contour information is a function indicating an ideal contour. The function is a function regarding a path length from a given point on a reference contour. The reference contour information is the reference contour information used by the ideal contour acquiring unit 14 to acquire the ideal contour information. That is to say, for example, if the ideal contour acquiring unit 14 acquires ideal contour information using the reference contour information accepted by the accepting unit 11, the ideal contour point acquiring unit 15 uses the reference contour information accepted by the accepting unit 11. For example, if the ideal contour acquiring unit 14 acquires an ideal contour using the reference contour information acquired by the transforming information acquiring unit 12, the ideal contour point acquiring unit 15 uses the reference contour information acquired by the transforming information acquiring unit 12.

Figure 3:
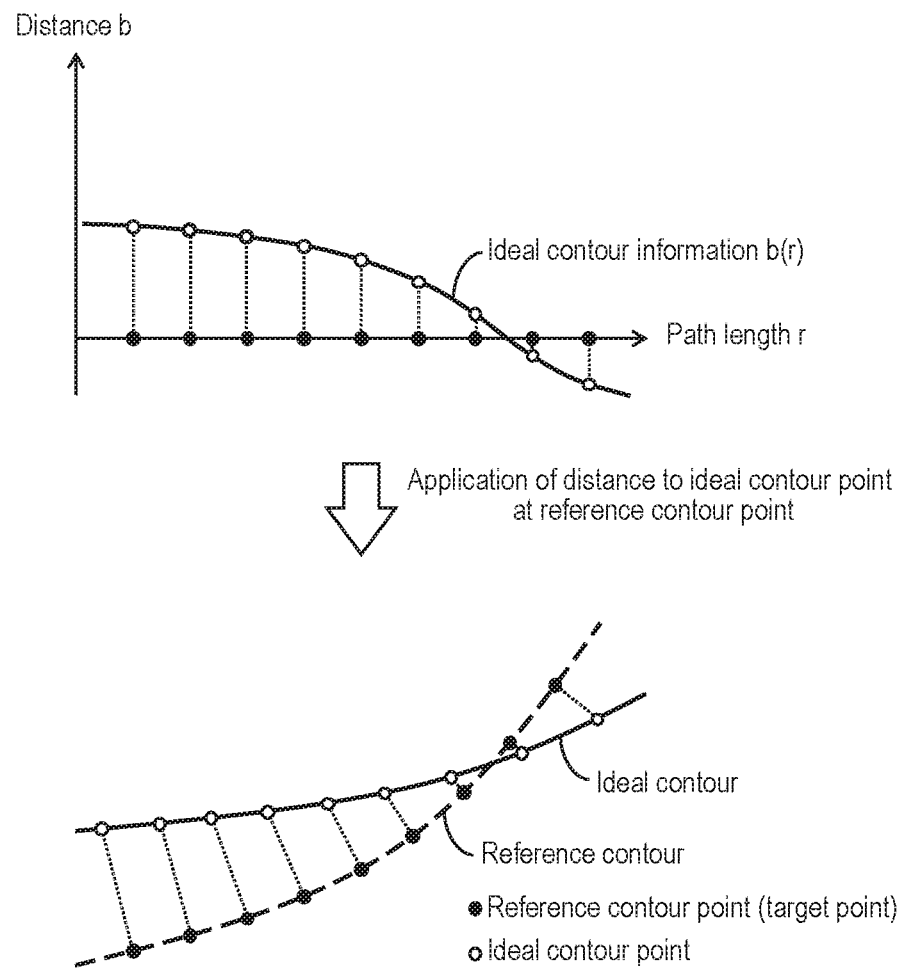
FIG. 3 is a schematic diagram of processing for calculating ideal contour points in the embodiment.

In this case, the ideal contour point acquiring unit 15 first calculates, for example, target points, which are three or more points at a given path length from the reference point on the reference contour. The intervals between the three or more target points are typically equal intervals, but there is no limitation to this. That is to say, the ideal contour point acquiring unit 15 typically calculates three or more target points at every predetermined path length from the reference point on the reference contour. The ideal contour point acquiring unit 15 may calculate, for example, three or more target points for any three or more different path lengths from the reference point on the reference contour. The ideal contour point acquiring unit 15 calculates distances respectively corresponding to the calculated three or more target points, using the ideal contour information (function). The ideal contour point acquiring unit 15 adds the calculated distances to the target points, thereby calculating ideal contour points. The ideal contour point acquiring unit 15 acquires ideal contour point information having coordinates of three or more ideal contour points. A schematic diagram of this processing is, for example, shown in FIG. 3.

Furthermore, the ideal contour point acquiring unit 15 acquires ideal contour point information, for example, using the ideal contour information. The ideal contour information is the ideal contour information acquired by the ideal contour acquiring unit 14. The ideal contour information is information having coordinates of all the three or more ideal contour points forming an ideal contour. In this case, the ideal contour point acquiring unit 15 acquires coordinates of three or more ideal contour points at predetermined intervals, from the ideal contour information. The ideal contour point acquiring unit 15 acquires ideal contour point information having the acquired coordinates of the three or more ideal contour points.

The output unit 16 typically outputs the ideal contour point information. The ideal contour point information is the ideal contour point information acquired by the ideal contour point acquiring unit 15. The output unit 16 outputs, for example, the corrected contour point information. The corrected contour point information is the corrected contour point information acquired by the corrected contour point acquiring unit 13. The ideal contour point information and the corrected contour point information output by the output unit 16 are typically calibration contour point information. That is to say, the output unit 16 outputs the ideal contour point information and the corrected contour point information, typically as calibration contour point information. The calibration contour point information is information used for calibration of the pattern figure. The calibration contour point information is also information having three or more sets of coordinates. The calibration contour point information is information accurately indicating a contour of a drawn figure, and may be referred to as information having coordinates of three or more points on a contour of a drawn figure.

Furthermore, to output is a concept that encompasses displaying on a display screen, performing projection using a projector, printing with a printer, outputting a sound, transmitting to an external apparatus, accumulating in a storage medium, delivering a processing result to another processing apparatus or another program, and the like. Note that it is assumed that in the case of transmitting or accumulating information or delivering a processing result, the output information is ultimately provided to a user.

Furthermore, the output unit 16 may be considered to include or to not include an output device such as a display screen or a speaker. The output unit 16 may be realized by driver software for an output device, a combination of driver software for an output device and the output device, or the like.

Note that the transforming information acquiring unit 12, the corrected contour point acquiring unit 13, the ideal contour acquiring unit 14, and the ideal contour point acquiring unit 15 may be realized typically by MPUs, memories, or the like. Typically, the processing procedure of the transforming information acquiring unit 12 and the like is realized by software, and the software is stored in a storage medium such as a ROM. Note that the transforming information acquiring unit 12 and the like may also be realized by hardware (dedicated circuits).

Figure 4:
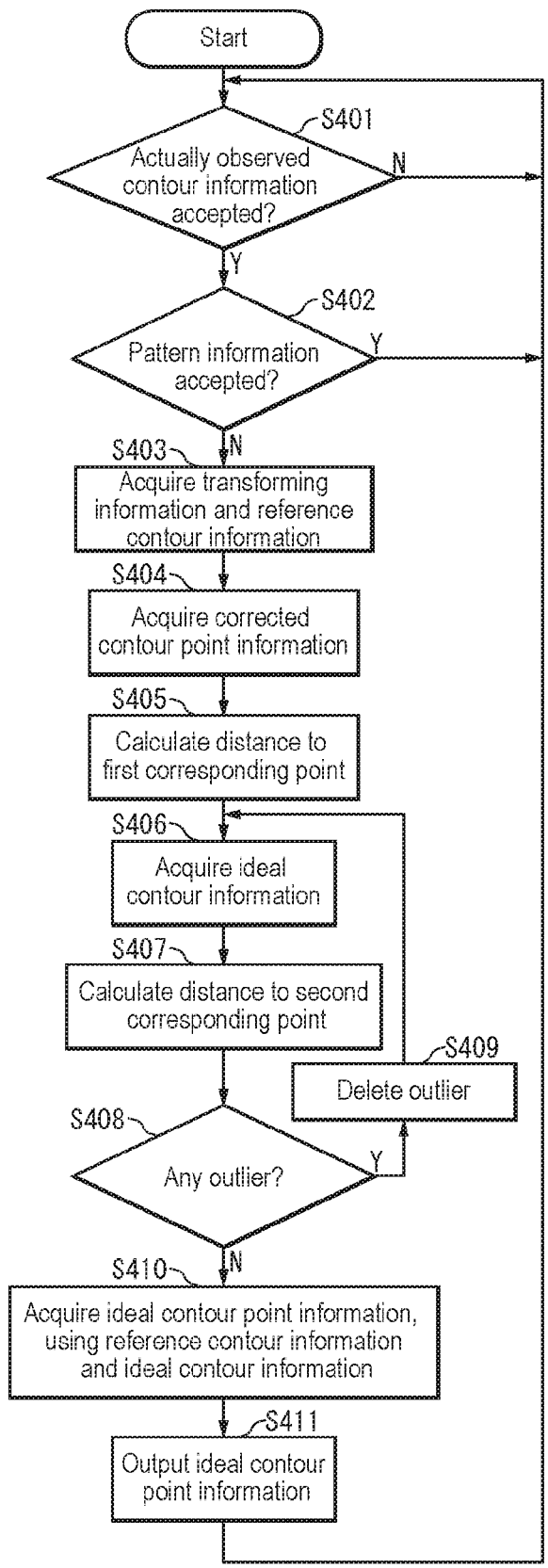
FIG. 4 is a flowchart illustrating the overall operation of the information processing apparatus 1 in the embodiment.

Next, the overall operations of the information processing apparatus 1 will be described with reference to flowcharts. Note that, in given information, an $i^{-th}$ piece of information is denoted by "information [i]". FIG. 4 is a flowchart illustrating the overall operation of the information processing apparatus 1. The information processing apparatus 1 acquires transforming information and reference contour information, using the pattern information and the actually observed contour information. Then, the information processing apparatus 1 acquires corrected contour point information, using the actually observed contour point information and the transforming information. The information processing apparatus 1 acquires ideal contour point information, using the corrected contour point information and the reference contour point information. The information processing apparatus 1 outputs the ideal contour point information.

(Step S401) The transforming information acquiring unit 12 determines whether or not the accepting unit 11 has accepted actually observed contour information. If the accepting unit 11 has accepted actually observed contour information, the procedure advances to step S402, and, if not, the procedure returns to step S401.

(Step S402) The transforming information acquiring unit 12 determines whether or not the accepting unit 11 has accepted pattern information. If the accepting unit 11 has accepted pattern information, the procedure advances to step S403, and, if not, the procedure returns to step S401.

(Step S403) The transforming information acquiring unit 12 acquires transforming information and reference contour information, using the actually observed contour information accepted in step S401 and the pattern information accepted in step S402.

(Step S404) The corrected contour point acquiring unit 13 acquires corrected contour point information, using the actually observed contour information accepted in step S401 and the transforming information calculated in step S403.

(Step S405) The ideal contour acquiring unit 14 calculates, for three or more corrected contour points indicated by the corrected contour point information, distances between the three or more corrected contour points and first corresponding points, using the reference contour information acquired in step S403 and the corrected contour point information acquired in step S404.

(Step S406) The ideal contour acquiring unit 14 acquires ideal contour information, which is a function indicating a curve that approximates distances between the three or more corrected contour points indicated by the corrected contour point information and the first corresponding points respectively corresponding to the three or more corrected contour points, and is a function for calculating the distances corresponding to the first corresponding points, based on path lengths from a reference point on the reference contour to the three or more first corresponding points.

(Step S407) The ideal contour acquiring unit 14 calculates, for three or more corrected contour points indicated by the corrected contour point information, distances between the three or more corrected contour points and second corresponding points.

(Step S408) The ideal contour acquiring unit 14 determines whether or not the three or more distances calculated in step S407 include an outlier (distance that is large enough to meet a predetermined condition). The ideal contour acquiring unit 14 determines, for example, whether or not any of the three or more distances calculated in step S407 is large enough to meet a predetermined condition. If any of the distances is large enough to meet the predetermined condition, the ideal contour acquiring unit 14 determines that it is an outlier, and, if not, the ideal contour acquiring unit 14 determines that it is not an outlier. If the number of distances determined as being outliers is one or more, the ideal contour acquiring unit 14 determines that there is an outlier. If the number of distances determined as being outliers is 0, the ideal contour acquiring unit 14 determines that there is no outlier. If there is an outlier, the procedure advances to step S409, and, if not, the procedure advances to step S410.

(Step S409) The ideal contour acquiring unit 14 deletes any corrected contour point corresponding to the distances determined as being outliers in step S408, from the corrected contour point information. The procedure returns to step S706.

(Step S410) The ideal contour point acquiring unit 15 acquires ideal contour point information, using the reference contour information acquired in step S403 and the ideal contour information acquired in step S406.

(Step S411) The output unit 16 outputs the ideal contour point information acquired in step S410. The output unit 16 may output, for example, the corrected contour point information acquired in step S404. The procedure returns to step S401.

Figure 5:
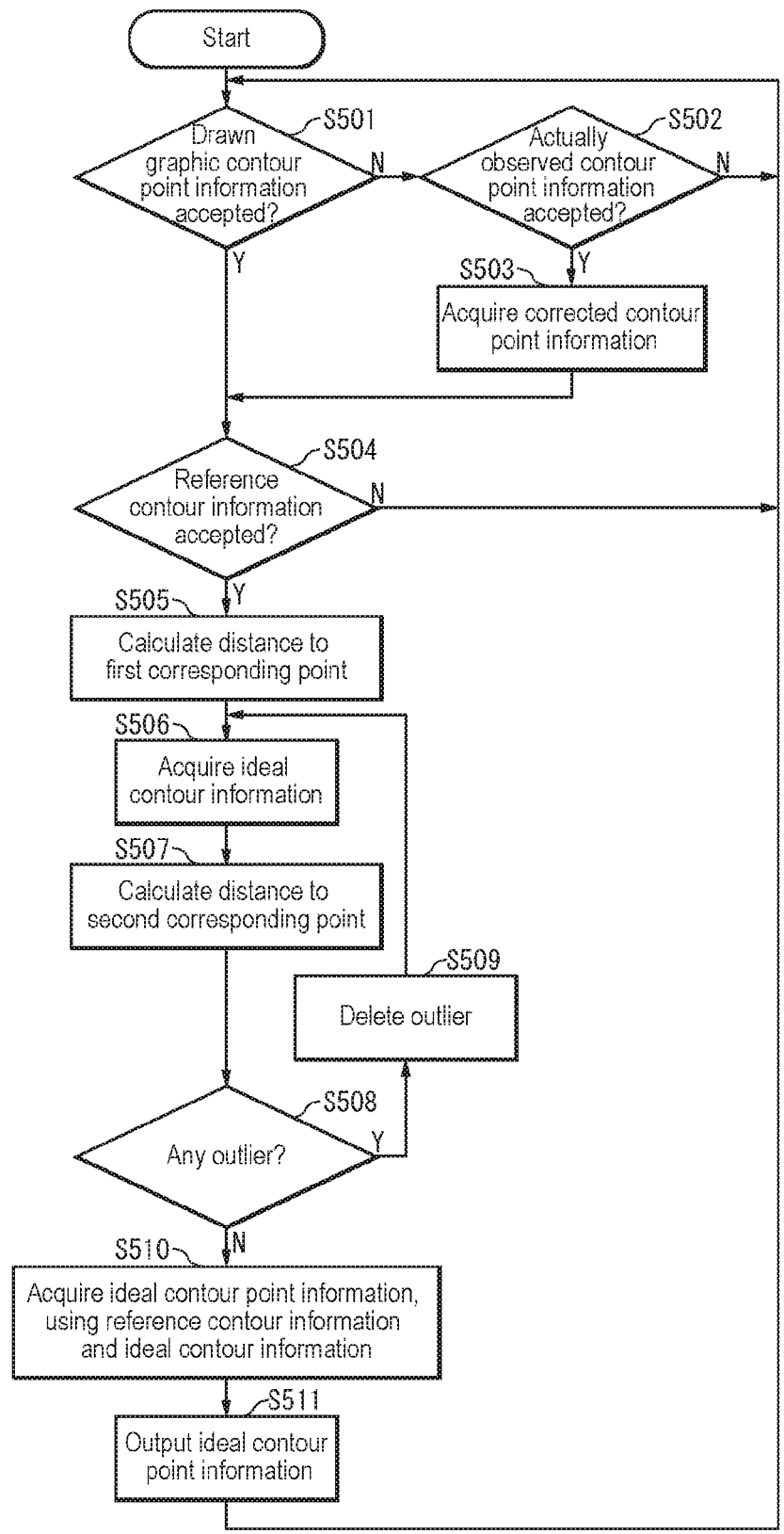
FIG. 5 is a flowchart illustrating the overall operation of the information processing apparatus 1 in the embodiment.

FIG. 5 is a flowchart illustrating the overall operation of the information processing apparatus 1 in the case of acquiring ideal contour point information using accepted drawn figure contour point information or acquired corrected contour point information, and outputting the ideal contour point information.

(Step S501) The ideal contour acquiring unit 14 determines whether or not the accepting unit 11 has accepted drawn figure contour point information. If the accepting unit 11 has accepted drawn figure contour point information, the procedure advances to step S504, and, if not, the procedure advances to step S502.

(Step S502) The ideal contour acquiring unit 14 determines whether or not the accepting unit 11 has accepted actually observed contour point information. If the accepting unit 11 has accepted actually observed contour point information, the procedure advances to step S503, and, if not, the procedure returns to step S501.

(Step S503) The corrected contour point acquiring unit 13 acquires corrected contour point information, using the actually observed contour point information accepted in step S502 and the transforming information held in advance.

(Step S504) The ideal contour acquiring unit 14 determines whether or not the accepting unit 11 has accepted reference contour information. If the accepting unit 11 has accepted reference contour information, the procedure advances to step S505, and, if not, the procedure returns to step S501.

(Step S505) In this example, the drawn figure contour point information accepted in step S501 and the corrected contour point information acquired in step S503 are taken as processing target point information. Also, the drawn figure contour points indicated by the drawn figure contour point information and the corrected contour points indicated by the corrected contour point information are taken as processing target points. The ideal contour acquiring unit 14 calculates, for three or more processing target points indicated by the processing target point information, distances between the three or more processing target points and first corresponding points, using the processing target point information and the reference contour information accepted in step S504.

(Step S506) The ideal contour acquiring unit 14 acquires ideal contour information, which is information indicating a curve that approximates distances between the three or more processing target points indicated by the processing target point information and the first corresponding points respectively corresponding to the three or more processing target points, and is a function for calculating the distances corresponding to the first corresponding points, based on path lengths from a reference point on the reference contour to the three or more first corresponding points.

(Step S507) The ideal contour acquiring unit 14 calculates, for three or more processing target points indicated by the processing target point information, distances between the three or more processing target points and second corresponding points.

(Step S508) The ideal contour acquiring unit 14 determines whether or not the three or more distances calculated in step S507 include an outlier (distance that is large enough to meet a predetermined condition). The ideal contour acquiring unit 14 determines, for example, whether or not any of the three or more distances calculated in step S507 is large enough to meet a predetermined condition. If any of the distances is large enough to meet the predetermined condition, the ideal contour acquiring unit 14 determines that it is an outlier and, if not, the ideal contour acquiring unit 14 determines that it is not an outlier. If the number of distances determined as being outliers is one or more, the ideal contour acquiring unit 14 determines that there is an outlier. If the number of distances determined as being outliers is 0, the ideal contour acquiring unit 14 determines that there is no outlier. If there is an outlier, the procedure advances to step S509, and, if not, the procedure advances to step S510.

(Step S509) The ideal contour acquiring unit 14 deletes processing target points corresponding to the distances determined as being outliers in step S508, from the processing target point information. The procedure returns to step S506.

(Step S510) The ideal contour point acquiring unit 15 acquires ideal contour point information, using the reference contour information accepted in step S504 and the ideal contour information acquired in step S506.

(Step S511) The output unit 16 outputs the ideal contour point information acquired in step S510. The procedure returns to step S501.

Note that the procedure is terminated by powering off or an interruption at the end of the process in the flowchart in FIG. 5.

Figure 6:
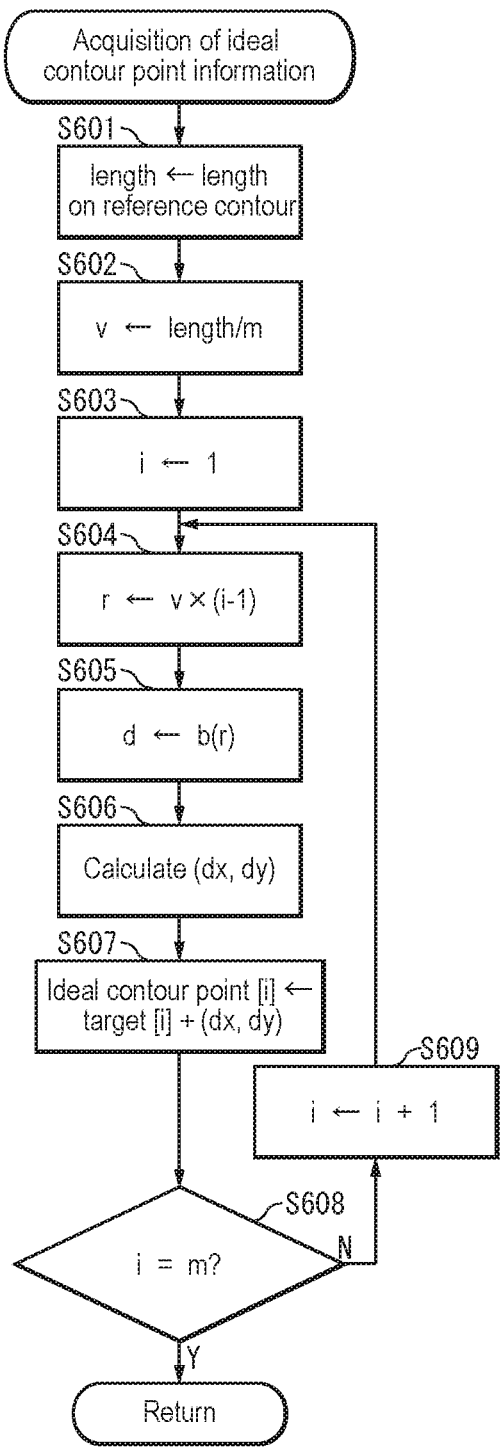
FIG. 6 is a flowchart illustrating processing for acquiring ideal contour point information in the embodiment.

A flowchart illustrating the processing for acquiring ideal contour point information in step S406 in the flowchart in FIG. 4 and step S506 in the flowchart in FIG. 5 is, for example, shown in FIG. 6. In FIG. 6, the ideal contour information is taken as a function b(r).

(Step S601) The ideal contour point acquiring unit 15 calculates a length on a reference contour, using the reference contour information, and sets the obtained value to a variable length.

(Step S602) The ideal contour point acquiring unit 15 calculates "length/m", and sets the obtained value to a variable v. Note that m is the number of target points on the reference contour, and v is a path length (interval) between two target points.

(Step S603) The ideal contour point acquiring unit 15 sets 1 to a counter i.

(Step S604) The ideal contour point acquiring unit 15 calculates "v×(i −1)", and sets the obtained value to a variable r. Note that r is a path length from the reference point on the reference contour to a target point [i].

(Step S605) The ideal contour point acquiring unit 15 calculates b(r), and sets the obtained value to a variable d.

(Step S606) The ideal contour point acquiring unit 15 acquires a normal line at the target point [i] with a length of d, and calculates an x component dx and a y component dy of the normal line.

(Step S607) The ideal contour point acquiring unit 15 adds (dx, dy) to the target point [i], and, and sets the obtained values to an ideal contour point [i]. Specifically, the ideal contour point acquiring unit 15 adds dx to the x coordinate of the target point [i], and sets the obtained value as the x coordinate of the ideal contour point [i]. Furthermore, the ideal contour point acquiring unit 15 adds dy to the y coordinate of the target point [i], and sets the obtained value as the y coordinate of the ideal contour point [i].

(Step S608) The ideal contour point acquiring unit 15 determines whether or not i is m. If i is m, the procedure returns to the upper-level processing, and, if not, the procedure advances to step S609.

(Step S609) The ideal contour point acquiring unit 15 increments i by 1. The procedure returns to step S604.

Note that the overall operations of the information processing apparatus 1 described above are merely examples. That is to say, the overall operations of the information processing apparatus 1 are not limited to those described above.

SPECIFIC EXAMPLES

Next, specific examples of the operation of the information processing apparatus 1 will be described.

Example 1

Figure 7:
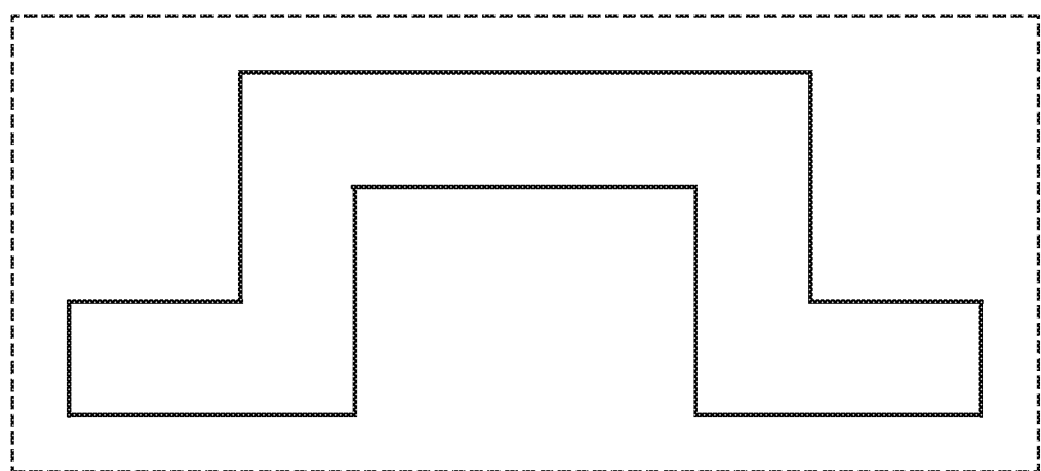
FIG. 7 is a view showing an example of a pattern figure in the embodiment.

Below, an example in which transforming information and reference contour information are acquired using the pattern information and the actually observed contour information, and corrected contour point information is acquired using the transforming information will be described. In this example, a pattern figure that is indicated by the pattern information and is to be drawn by an electron beam writer is deemed to be that shown in FIG. 7.

Figure 8:
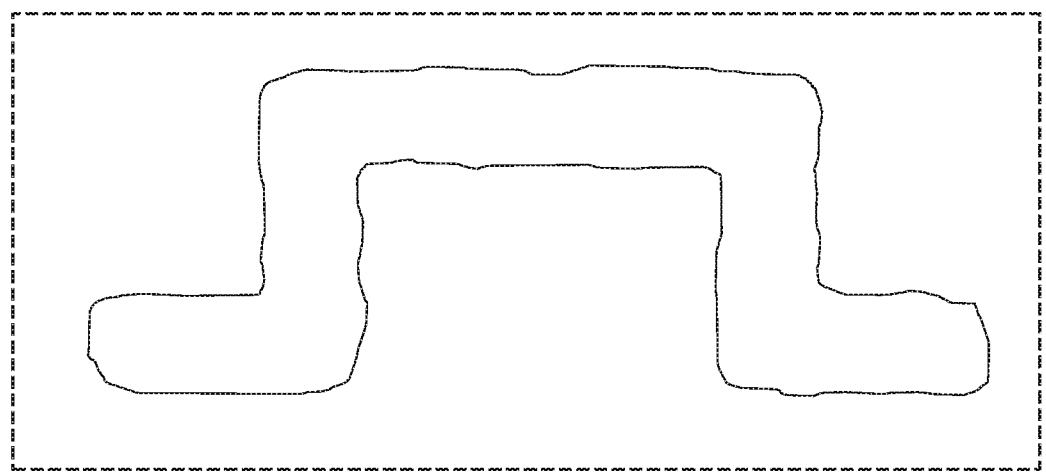
FIG. 8 is a view showing an example of an actually observed contour in the embodiment.

First, the accepting unit 11 accepts pattern information and actually observed contour information. An actually observed contour indicated by the actually observed contour information is, for example, shown in FIG. 8. The actually observed contour information is, for example, shown in FIG. 9. The actually observed contour information has IDs for uniquely specifying records and coordinates of three or more actually observed contour points. The item name "x" is an x coordinate of an actually observed contour point, and the item name "y" is a y coordinate of the actually observed contour point.

Next, the transforming information acquiring unit 12 calculates α and T that minimize the value calculated from Formula 1, using the pattern information and the actually observed contour information accepted by the accepting unit 11. The method, the procedure, and the like for calculating these α and T are known, and thus a detailed description thereof has been omitted.

Figure 11:
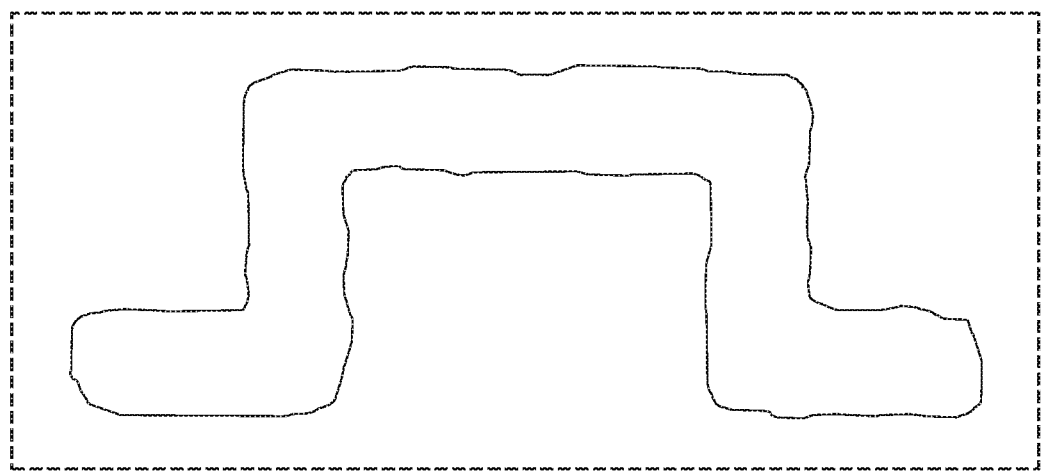
FIG. 11 is a view showing an example of a corrected contour in the embodiment.

Next, the corrected contour point acquiring unit 13 applies the transforming information represented by the calculated α to the coordinates of the actually observed contour points in FIG. 9. The corrected contour point acquiring unit 13 calculates corrected contour point information. The corrected contour point information is, for example, shown in FIG. 10. A corrected contour represented by the corrected contour points indicated by the three or more pieces of corrected contour point information in FIG. 10 is, for example, shown in FIG. 11.

Example 2

Below, an example in which ideal contour point information is acquired using the corrected contour point information or the drawn figure contour point information, and the reference contour information, will be described. It is assumed that, in this example, the case of using the corrected contour point information will be described. That is to say, the case of using the drawn figure contour point information will be understood by replacing "corrected contour points" in this example with "drawn figure contour points". The drawn figure contour point information is accepted by the accepting unit 11.

First, the ideal contour acquiring unit 14 calculates, for the three or more corrected contour points indicated by the corrected contour point information acquired by the corrected contour point acquiring unit 13, first corresponding points on the reference contour. The ideal contour acquiring unit 14 calculates distances between the three or more corrected contour points and the first corresponding points respectively corresponding to the corrected contour points. The ideal contour acquiring unit 14 calculates path lengths r from the reference point on the reference contour to the first corresponding points, and associates the corrected contour points corresponding to the first corresponding points with the first corresponding points. As a result, the ideal contour acquiring unit 14 acquires, for example, information shown in FIG. 12. The information has IDs for uniquely specifying records, the coordinates of the corrected contour points, the path lengths (item name: r) from the reference point to the first corresponding points respectively corresponding to the corrected contour points, and the distances (item name: b) between the corrected contour points and the first corresponding points. The item name "x" is an x coordinate of a corrected contour point, and the item name "y" is a y coordinate of the corrected contour point. A graph representing a relationship between r and d in FIG. 12 is, for example, shown in FIG. 13.

Figure 13:
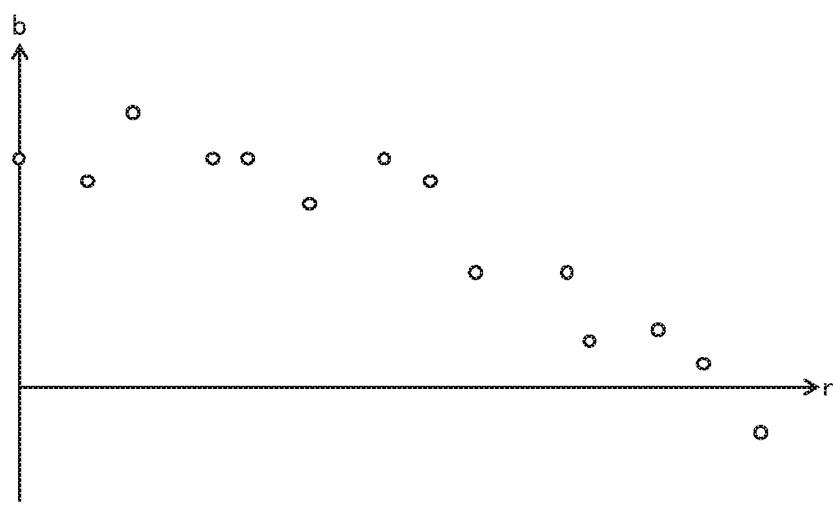
FIG. 13 is a graph showing corrected contour points in the embodiment.

Next, the ideal contour acquiring unit 14 calculates a function of r that approximates b, using the graph in FIG. 13. When the function is taken as b(r), a curve represented by b(r) is, for example, shown in FIG. 14. The curve is an ideal contour. The function b(r) indicating the curve is the ideal contour information.

Figure 14:
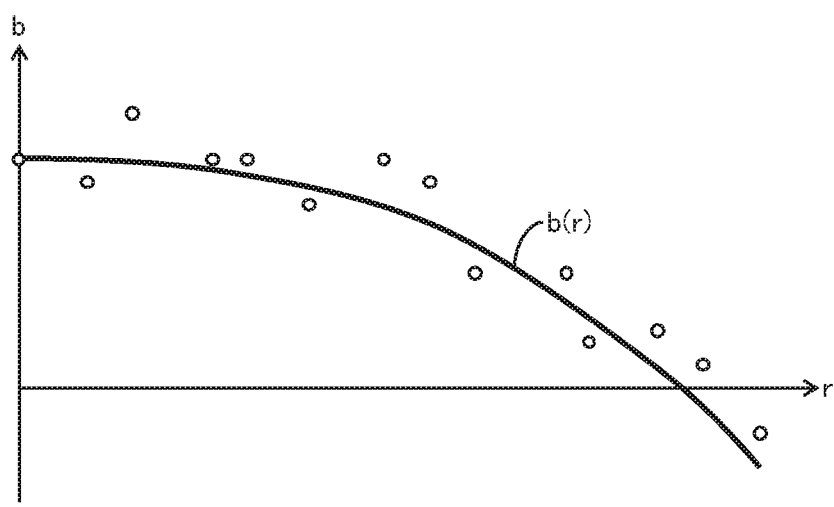
FIG. 14 is a graph showing an ideal contour in the embodiment.
Figure 15:
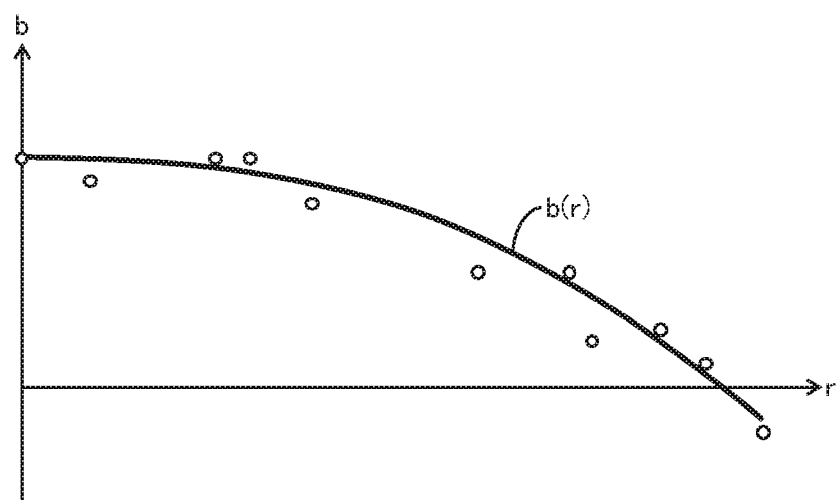
FIG. 15 is a graph showing an ideal contour after removal of corrected contour points in the embodiment.
Figure 16:
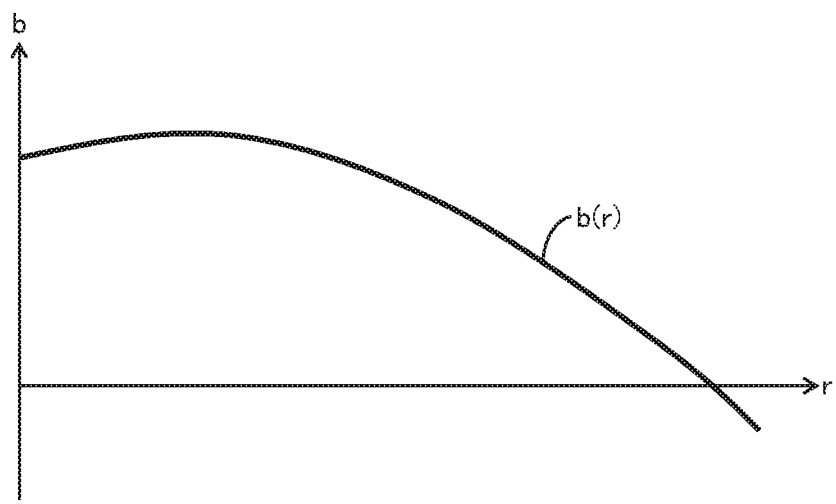
FIG. 16 is a graph showing an ideal contour in the embodiment.

Next, the ideal contour acquiring unit 14 removes any corrected contour point whose distance from the ideal contour information is large enough to meet a predetermined condition, from the graph in FIG. 14. The ideal contour acquiring unit 14 calculates a function b(r) that approximates b corresponding to corrected contour points after the removal. A curve indicated by b(r) after the removal is, for example, shown in FIG. 15. The ideal contour acquiring unit 14 repeats the processing for removing corrected contour points that are outliers and the processing for calculating a function b(r) that approximates b corresponding to corrected contour points after the removal, until a so-called end condition is satisfied, thereby acquiring ideal contour information. A curve indicated by the ideal contour information b(r) ultimately acquired by the ideal contour acquiring unit 14 is, for example, shown in FIG. 16.

Next, the ideal contour point acquiring unit 15 calculates target points, which are points at every predetermined path length from the reference point on the reference contour. The ideal contour point acquiring unit 15 calculates, using the function b(r) that is the ideal contour information acquired by the ideal contour acquiring unit 14 and the path lengths r respectively corresponding to the calculated three or more target points, distances b from the target points to the ideal contour. The ideal contour point acquiring unit 15 associates r to the target points, the coordinates of the target points, and b at the target points. As a result, the ideal contour point acquiring unit 15 acquires, for example, the information shown in FIG. 17. The information has IDs for uniquely specifying records, the path lengths (item name: r) from the reference point to the target points, the coordinates of the target points, and the distances (item name: b) from the target points to the corrected contour points. The item name "x" is an x coordinate of a target point, and the item name "y" is a y coordinate of the target point.

Next, the ideal contour point acquiring unit 15 calculates normal lines with respect to the reference contour, at the three or more target points in FIG. 17. The ideal contour point acquiring unit 15 applies b corresponding to the target points to the calculated normal lines, thereby calculating x and y components of the b. The ideal contour point acquiring unit 15 adds the calculated x and y components respectively to the x and y components in FIG. 17, thereby calculating the coordinates of ideal contour points. The ideal contour point acquiring unit 15 acquires ideal contour point information having coordinates of three or more ideal contour points. The ideal contour point information is, for example, shown in FIG. 18.

As described above, according to the information processing apparatus 1 of this embodiment, it is possible to more precisely acquire information indicating three or more points on a contour of a figure drawn by an electron beam writer. As a result, parameters used to correct a pattern figure can be more precisely calibrated. Furthermore, as a result, the pattern figure can be more precisely corrected.

Figure 19:
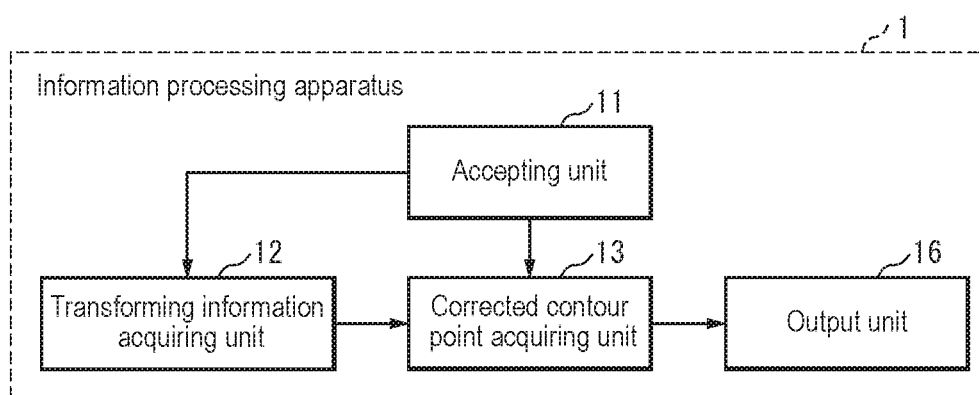
FIG. 19 is a block diagram of the information processing apparatus 1 in the embodiment.

In this embodiment, the information processing apparatus 1 may not include, for example, the ideal contour acquiring unit 14 and the ideal contour point acquiring unit 15. A block diagram of the information processing apparatus 1 in this case is shown in FIG. 19. In this case, the accepting unit 11 typically accepts pattern information and actually observed contour information. The transforming information acquiring unit 12 acquires transforming information, for example, using the pattern information and the actually observed contour information. The corrected contour point acquiring unit 13 acquires corrected contour point information, for example, using the actually observed contour information and the acquired transforming information. The corrected contour point acquiring unit 13 acquires corrected contour point information, for example, using the actually observed contour information and the held transforming information. The output unit 16 outputs the corrected contour point information acquired by the corrected contour point acquiring unit 13.

Figure 20:
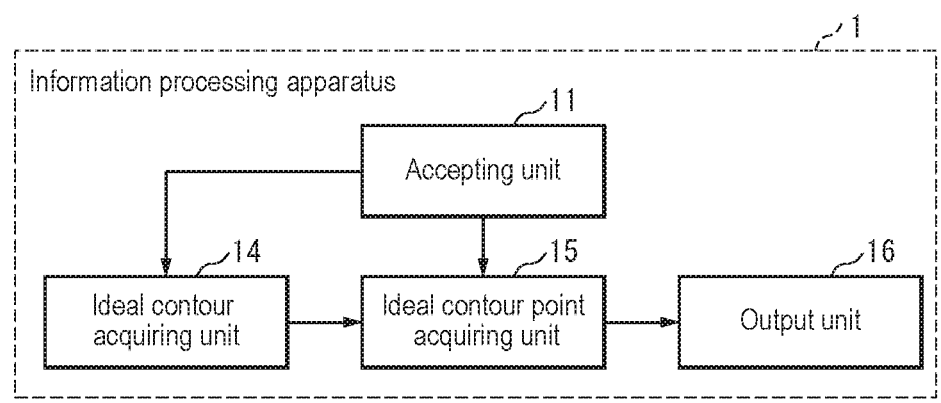
FIG. 20 is a block diagram of the information processing apparatus 1 in the embodiment.

Furthermore, in this embodiment, the information processing apparatus 1 may not include, for example, the transforming information acquiring unit 12 and the corrected contour point acquiring unit 13. A block diagram of the information processing apparatus 1 in this case is shown in FIG. 20. In this case, the accepting unit 11 typically accepts drawn figure contour point information and reference contour information. The ideal contour acquiring unit 14 acquires ideal contour information, for example, using the drawn figure contour point information and the reference contour information. The ideal contour point acquiring unit 15 acquires ideal contour point information, using the reference contour information and the ideal contour information. The output unit 16 outputs the ideal contour point information acquired by the ideal contour point acquiring unit 15.

Furthermore, the information processing apparatus in the foregoing embodiment may be, for example, either a stand-alone apparatus or a server apparatus in a server-client system.

Furthermore, in the foregoing embodiment, each process or each function may be realized as centralized processing using a single apparatus or a single system, or may be realized as distributed processing using multiple apparatuses.

Furthermore, in the foregoing embodiment, each constituent element may be configured by dedicated hardware, or, alternatively, constituent elements that can be realized by software may be realized by executing a program. For example, each constituent element may be realized by a program execution unit such as a CPU reading and executing a software program stored in a storage medium such as a hard disk or a semiconductor memory.

The software that realizes the information processing apparatus in the foregoing embodiment may be the following sort of program. Specifically, this program is a program for causing a computer to function as: an accepting unit that accepts pattern information, which is information indicating a pattern figure that is a figure that is to be drawn by an electron beam writer, and actually observed contour information, which is information acquired using an image obtained by capturing an image of a figure drawn according to the pattern figure by the electron beam writer, and indicating an actually observed contour that is a contour of the figure; a transforming information acquiring unit that acquires, using the pattern information and the actually observed contour information, transforming information, which is information for correcting three or more actually observed contour points that are points on the actually observed contour respectively into three or more corrected contour points that are points obtained by correcting the three or more actually observed points, and is information that minimizes the sum of squares of differences between convolution values corresponding to the three or more corrected contour points of a given point spread function in a region indicated by the pattern figure and a threshold regarding the convolution values; a corrected contour point acquiring unit that acquires the three or more corrected contour points respectively corresponding to the three or more actually observed contour points, using the actually observed contour information and the transforming information, and acquires corrected contour point information, which is information indicating the acquired three or more corrected contour points; and an output unit that outputs the corrected contour point information.

Furthermore, the software that realizes the information processing apparatus in the foregoing embodiment may be the following sort of program. Specifically, this program is a program for causing a computer to function as: an accepting unit that accepts drawn figure contour point information, which is information indicating three or more drawn figure contour points that are points on a contour of a figure drawn according to a pattern figure by an electron beam writer, and reference contour information, which is information indicating a reference contour that is any one isoline of one or more isolines in a distribution of convolution values corresponding to the three or more drawn figure contour points of a given point spread function in a region indicated by the pattern figure; an ideal contour acquiring unit that acquires distances between the three or more drawn figure contour points and corresponding points that are points on the reference contour respectively corresponding to the three or more drawn figure contour points, using the drawn figure contour point information and the reference contour information, acquires ideal contour information, which is a function for acquiring the distances based on path lengths from a given point on the reference contour to the corresponding points, and is a function indicating an ideal contour that is a curve that approximates the distances, and acquires ideal contour information by repeating once or more processing for deleting any drawn figure contour point whose distance from the ideal contour indicated by the ideal contour information is large enough to meet a predetermined condition and processing for acquiring the ideal contour information using distances between three or more drawn figure contour points after the deletion and corresponding points respectively corresponding to the three or more drawn figure contour points; an ideal contour point acquiring unit that acquires distances from target points, which are three or more points at a given path length from a given point on the reference contour, to points on the ideal contour respectively corresponding to the target points, using the reference contour information and the ideal contour information, acquires points at the acquired distances respectively from the target points, and acquires ideal contour point information, which is information indicating three or more ideal contour points that are the acquired points; and an output unit that outputs the ideal contour point information.

In the programs, the functions realized by the programs do not include functions that can be realized only by hardware.

Furthermore, the programs may be executed by downloads from a server or the like, or may be executed by reading a program stored in a predetermined storage medium (e.g., an optical disk such as a CD-ROM, a magnetic disk, a semiconductor memory, etc.). Furthermore, the program may be used as a program forming a program product.

Furthermore, the computer that executes this program may be a single computer, or may be multiple computers. That is to say, centralized processing may be performed, or distributed processing may be performed.

Figure 21:
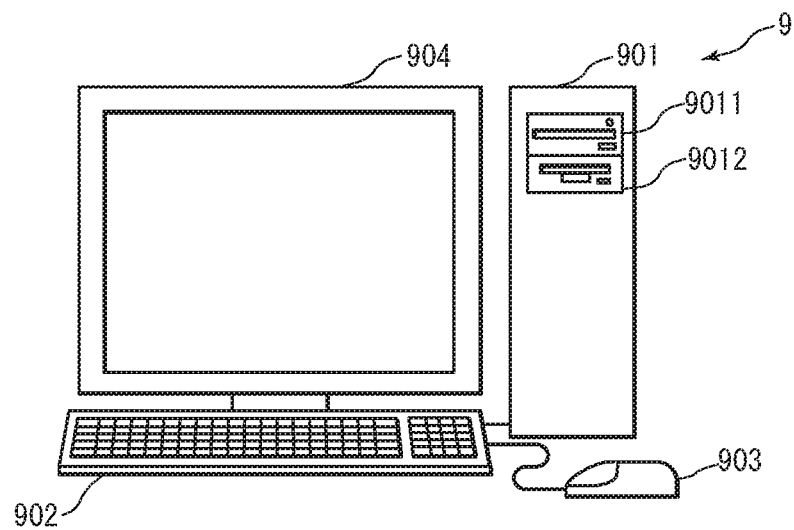
FIG. 21 is a schematic view of a computer system in the embodiment.

FIG. 21 is a schematic view showing a computer system 9 that executes the programs described above to realize the information processing apparatus and the like in the foregoing embodiment. The foregoing embodiment may be realized using computer hardware and computer programs executed thereon.

In FIG. 21, the computer system 9 is provided with a computer 901 including a CD-ROM drive 9011, a keyboard 902, a mouse 903, and a monitor 904.

Figure 22:
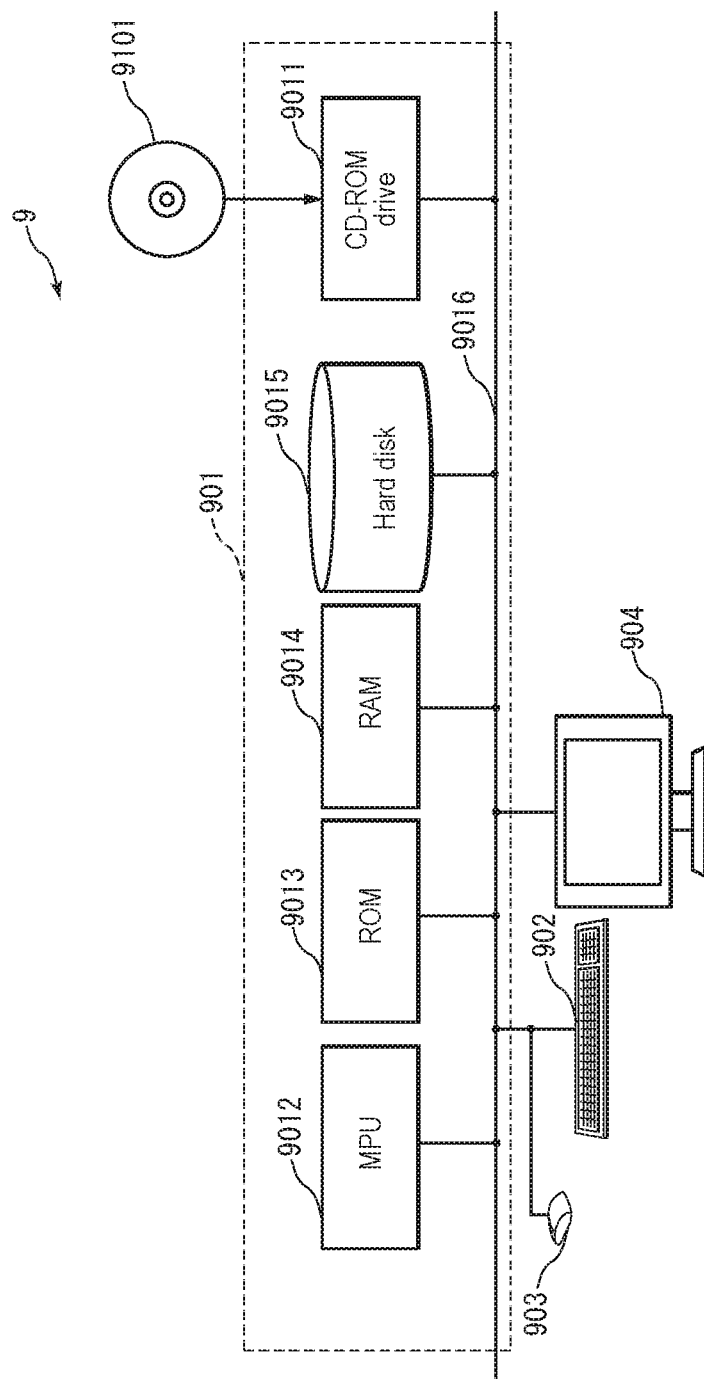
FIG. 22 is a block diagram of the computer system in the embodiment.

FIG. 22 is a block diagram of the computer system 9. In FIG. 22, the computer 901 is provided with, in addition to the CD-ROM drive 9011, an MPU 9012, a ROM 9013 in which a program such as a boot up program is to be stored, an RAM 9014 that is connected to the MPU 9012 and is a memory in which a command of an application program is temporarily stored and a temporary storage area is provided, a hard disk 9015 in which an application program, a system program, and data are stored, and a bus 9016 that connects the CD-ROM drive 9011, the MPU 9012, and the like. Although not shown, the computer 901 may further include a network card that provides connection to a LAN.

The program for causing the computer system 9 to execute the functions of the information processing apparatus and the like in the foregoing embodiment may be stored in a CD-ROM 9101 that is inserted into the CD-ROM drive 9011, and be transmitted to the hard disk 9015. Alternatively, the program may be transmitted via an unshown network to the computer 901 and stored in the hard disk 9015. At the time of execution, the program is loaded into the RAM 9014. The program may be loaded from the CD-ROM 9101 or directly from a network.

The program does not necessarily have to include, for example, an operating system (OS) or a third party program to cause the computer 901 to execute the functions of the information processing apparatus and the like in the foregoing embodiment. The program may only include a command portion to call an appropriate function (module) in a controlled mode and obtain desired results. The manner in which the computer system 9 operates is well known, and thus a detailed description thereof has been omitted.

The present invention is not limited to the embodiment set forth herein. Various modifications are possible within the scope of the present invention.

INDUSTRIAL APPLICABILITY

As described above, the information processing apparatus according to the present invention has an effect that information indicating three or more points on a contour of a figure drawn by an electron beam writer can be more precisely acquired, and thus this apparatus is useful as an apparatus that performs MPC.

LIST OF REFERENCE NUMERALS

1 Information processing apparatus
11 Accepting unit
12 Transforming information acquiring unit
13 Corrected contour point acquiring unit
14 Ideal contour acquiring unit
15 Ideal contour point acquiring unit
16 Output unit

The invention claimed is:

1. An information processing apparatus comprising:
a computer, and
a non-transitory storage medium in which a program is stored, wherein:
the program, when executed by the computer, causes the computer to perform:
accepting pattern information, which is information indicating a pattern figure that is a figure that is to be drawn by an electron beam writer, and actually observed contour information, which is information acquired using an image obtained by capturing an image of a figure drawn according to the pattern figure by the electron beam writer, and indicating an actually observed contour that is a contour of the figure;
acquiring, using the pattern information and the actually observed contour information, transforming information, which is information for correcting three or more actually observed contour points that are points on the actually observed contour respectively into three or more corrected contour points that are points obtained by correcting the three or more actually observed points, and is information that minimizes the sum of squares of differences between convolution values corresponding to the three or more corrected contour points of a given point spread function in a region indicated by the pattern figure and a threshold regarding the convolution values;
acquiring the three or more corrected contour points respectively corresponding to the three or more actually observed contour points, using the actually observed contour information and the transforming information, and acquires corrected contour point information, which is information indicating the acquired three or more corrected contour points; and
outputting the corrected contour point information.

2. The information processing apparatus according to claim 1, wherein the program, when executed by a computer, further causes the computer to perform:
acquiring ideal contour point information, which is information indicating three or more ideal contour points that are points on a curve that approximates the three or more corrected contour points, using the corrected contour point information; and
outputting the ideal contour point information.

3. The information processing apparatus according to claim 1, wherein:
in the acquiring the transforming information, transforming information and a threshold that minimize the sum of squares of the differences are acquired, the threshold being a threshold regarding the convolution values, using the pattern information and the actually observed contour information, and reference contour information, which is information indicating a reference contour that is any one isoline of one or more isolines in a distribution of convolution values of a given point spread function in a region indicated by the pattern figure, is acquired using the threshold and the pattern information, the program, when executed by a computer, further causes the computer to perform:

acquiring distances between the three or more corrected contour points and corresponding points that are points on the reference contour respectively corresponding to the three or more corrected contour points, using the corrected contour point information and the reference contour information, acquires ideal contour information, which is a function for acquiring the distances based on path lengths from a given point on the reference contour to the corresponding points, and is a function indicating an ideal contour that is a curve that approximates the distances, and acquires the ideal contour information by repeating once or more processing for deleting any corrected contour point whose distance from the ideal contour indicated by the ideal contour information is large enough to meet a predetermined condition and processing for acquiring the ideal contour information using distances between three or more corrected contour points after the deletion and corresponding points respectively corresponding to the three or more corrected contour points;

acquiring distances from target points, which are three or more points at a given path length from a given point on the reference contour, to points on the ideal contour respectively corresponding to the target points, using the reference contour information and the ideal contour information, acquires points at the acquired distances respectively from the target points, and acquires ideal contour point information, which is information indicating three or more ideal contour points that are the acquired points; and outputting the ideal contour point information.

4. An information processing apparatus comprising:
a computer, and
a non-transitory storage medium in which a program is stored, wherein:
the program, when executed by the computer, causes the computer to perform:

accepting drawn figure contour point information, which is information indicating three or more drawn figure contour points that are points on a contour of a figure drawn according to a pattern figure by an electron beam writer, and reference contour information, which is information indicating a reference contour that is any one isoline of one or more isolines in a distribution of convolution values corresponding to the three or more drawn figure contour points of a given point spread function in a region indicated by the pattern figure;

acquiring distances between the three or more drawn figure contour points and corresponding points that are points on the reference contour respectively corresponding to the three or more drawn figure contour points, using the drawn figure contour point information and the reference contour information, acquires ideal contour information, which is a function for acquiring the distances based on path lengths from a given point on the reference contour to the corresponding points, and is a function indicating an ideal contour that is a curve that approximates the distances, and acquires ideal contour information by repeating once or more processing for deleting any drawn figure contour point whose distance from the ideal contour indicated by the ideal contour information is large enough to meet a predetermined condition and processing for acquiring the ideal contour information using distances between three or more drawn figure contour points after the deletion and corresponding points respectively corresponding to the three or more drawn figure contour points;

acquiring distances from target points, which are three or more points at a given path length from a given point on the reference contour, to points on the ideal contour respectively corresponding to the target points, using the reference contour information and the ideal contour information, acquires points at the acquired distances respectively from the target points, and acquires ideal contour point information, which is information indicating three or more ideal contour points that are the acquired points; and outputting the ideal contour point information.

5. The information processing apparatus according to claim 4, wherein:

the drawn figure contour point information is actually observed contour point information, which is information acquired using an image obtained by capturing an image of a figure drawn according to the pattern figure by the electron beam writer, and indicating three or more actually observed contour points that are points on an actually observed contour that is a contour of the figure, the program, when executed by a computer, further causes the computer to perform:

acquiring points on a coordinate system of the reference contour corresponding to the three or more actually observed contour points, and acquires corrected contour point information, which is information indicating three or more corrected contour points that are the acquired points, and acquiring the ideal contour information, using the reference contour information and the corrected contour point information.

6. An information processing method performed by a computer the method comprising:

accepting pattern information, which is information indicating a pattern figure that is a figure that is to be drawn by an electron beam writer, and actually observed contour information, which is information acquired using an image obtained by capturing an image of a figure drawn according to the pattern figure by the electron beam writer, and indicating an actually observed contour that is a contour of the figure;

acquiring, using the pattern information and the actually observed contour information, transforming information, which is information for correcting three or more actually observed contour points that are points on the actually observed contour respectively into three or more corrected contour points that are points obtained by correcting the three or more actually observed points, and is information that minimizes the sum of squares of differences between convolution values corresponding to the three or more corrected contour points of a given point spread function in a region indicated by the pattern figure and a threshold regarding the convolution values;

acquiring the three or more corrected contour points respectively corresponding to the three or more actually observed contour points, using the actually observed contour information and the transforming information, and acquiring corrected contour point information, which is information indicating the acquired three or more corrected contour points; and outputting the corrected contour point information.

7. The information processing method according to claim 6, further comprising:

acquiring ideal contour point information, which is information indicating three or more ideal contour points that are points on a curve that approximates the three or more corrected contour points, using the corrected contour point information; and outputting the ideal contour point information.

8. The information processing method according to claim 6, wherein:

in the acquiring the transforming information, transforming information and a threshold that minimize the sum of squares of the differences are acquired, the threshold being a threshold regarding the convolution values, using the pattern information and the actually observed contour information, and reference contour information, which is information indicating a reference contour that is any one isoline of one or more isolines in a distribution of convolution values of a given point spread function in a region indicated by the pattern figure, is acquired using the threshold and the pattern information, and the information processing method further comprises:

acquiring distances between the three or more corrected contour points and corresponding points that are points on the reference contour respectively corresponding to the three or more corrected contour points, using the corrected contour point information and the reference contour information, acquires ideal contour information, which is a function for acquiring the distances based on path lengths from a given point on the reference contour to the corresponding points, and is a function indicating an ideal contour that is a curve that approximates the distances, and acquires the ideal contour information by repeating once or more processing for deleting any corrected contour point whose distance from the ideal contour indicated by the ideal contour information is large enough to meet a predetermined condition and processing for acquiring the ideal contour information using distances between three or more corrected contour points after the deletion and corresponding points respectively corresponding to the three or more corrected contour points;

acquiring distances from target points, which are three or more points at a given path length from a given point on the reference contour, to points on the ideal contour respectively corresponding to the target points, using the reference contour information and the ideal contour information, acquires points at the acquired distances respectively from the target points, and acquires ideal contour point information, which is information indicating three or more ideal contour points that are the acquired points; and outputting the ideal contour point information.

9. An information processing method performed by a computer, the method comprising:

accepting drawn figure contour point information, which is information indicating three or more drawn figure contour points that are points on a contour of a figure drawn according to a pattern figure by an electron beam writer, and reference contour information, which is information indicating a reference contour that is any one isoline of one or more isolines in a distribution of convolution values corresponding to the three or more drawn figure contour points of a given point spread function in a region indicated by the pattern figure;

acquiring distances between the three or more drawn figure contour points and corresponding points that are points on the reference contour respectively corresponding to the three or more drawn figure contour points, using the drawn figure contour point information and the reference contour information, acquiring ideal contour information, which is a function for acquiring the distances based on path lengths from a given point on the reference contour to the corresponding points, and is a function indicating an ideal contour that is a curve that approximates the distances, and acquiring ideal contour information by repeating once or more processing for deleting any drawn figure contour point whose distance from the ideal contour indicated by the ideal contour information is large enough to meet a predetermined condition and processing for acquiring the ideal contour information using distances between three or more drawn figure contour points after the deletion and corresponding points respectively corresponding to the three or more drawn figure contour points;

acquiring distances from target points, which are three or more points at a given path length from a given point on the reference contour, to points on the ideal contour respectively corresponding to the target points, using the reference contour information and the ideal contour information, acquiring points at the acquired distances respectively from the target points, and acquiring ideal contour point information, which is information indicating three or more ideal contour points that are the acquired points; and outputting the ideal contour point information.

10. The information processing method according to claim 9, wherein:

the drawn figure contour point information is actually observed contour point information, which is information acquired using an image obtained by capturing an image of a figure drawn according to the pattern figure by the electron beam writer, and indicating three or more actually observed contour points that are points on an actually observed contour that is a contour of the figure, and the information processing method further comprises:

acquiring points on a coordinate system of the reference contour corresponding to the three or more actually observed contour points, and acquires corrected contour point information, which is information indicating three or more corrected contour points that are the acquired points; and acquiring the ideal contour information, using the reference contour information and the corrected contour point information.

11. A non-transitory storage medium in which a program is stored, the program, when executed by a computer, causing the computer to perform:

accepting pattern information, which is information indicating a pattern figure that is a figure that is to be drawn by an electron beam writer, and actually observed contour information, which is information acquired using an image obtained by capturing an image of a figure drawn according to the pattern figure by the electron beam writer, and indicating an actually observed contour that is a contour of the figure;

acquiring, using the pattern information and the actually observed contour information, transforming information, which is information for correcting three or more actually observed contour points that are points on the actually observed contour respectively into three or more corrected contour points that are points obtained by correcting the three or more actually observed points, and is information that minimizes the sum of squares of differences between convolution values corresponding to the three or more corrected contour points of a given point spread function in a region indicated by the pattern figure and a threshold regarding the convolution values;

acquiring the three or more corrected contour points respectively corresponding to the three or more actually observed contour points, using the actually observed contour information and the transforming information, and acquires corrected contour point information, which is information indicating the acquired three or more corrected contour points; and outputting the corrected contour point information.

12. The non-transitory storage medium according to claim 11, wherein the program, when executed by the computer, further causes the computer to perform:

acquiring ideal contour point information, which is information indicating three or more ideal contour points that are points on a curve that approximates the three or more corrected contour points, using the corrected contour point information; and outputting the ideal contour point information.

13. The non-transitory storage medium according to claim 11, wherein:

in the acquiring the transforming information, transforming information and a threshold that minimize the sum of squares of the differences are acquired, the threshold being a threshold regarding the convolution values, using the pattern information and the actually observed contour information, and reference contour information, which is information indicating a reference contour that is any one isoline of one or more isolines in a distribution of convolution values of a given point spread function in a region indicated by the pattern figure is acquired, using the threshold and the pattern information, the program, when executed by a computer, further causes the computer to perform:

acquiring distances between the three or more corrected contour points and corresponding points that are points on the reference contour respectively corresponding to the three or more corrected contour points, using the corrected contour point information and the reference contour information, acquires ideal contour information, which is a function for acquiring the distances based on path lengths from a given point on the reference contour to the corresponding points, and is a function indicating an ideal contour that is a curve that approximates the distances, and acquires the ideal contour information by repeating once or more processing for deleting any corrected contour point whose distance from the ideal contour indicated by the ideal contour information is large enough to meet a predetermined condition and processing for acquiring the ideal contour information using distances between three or more corrected contour points after the deletion and corresponding points respectively corresponding to the three or more corrected contour points;

acquiring distances from target points, which are three or more points at a given path length from a given point on the reference contour, to points on the ideal contour respectively corresponding to the target points, using the reference contour information and the ideal contour information, acquires points at the acquired distances respectively from the target points, and acquires ideal contour point information, which is information indicating three or more ideal contour points that are the acquired points; and outputting the ideal contour point information.

14. A non-transitory storage medium in which a program is stored, the program, when executed by a computer, causing the computer to perform:

accepting drawn figure contour point information, which is information indicating three or more drawn figure contour points that are points on a contour of a figure drawn according to a pattern figure by an electron beam writer, and reference contour information, which is information indicating a reference contour that is any one isoline of one or more isolines in a distribution of convolution values corresponding to the three or more drawn figure contour points of a given point spread function in a region indicated by the pattern figure;

acquiring distances between the three or more drawn figure contour points and corresponding points that are points on the reference contour respectively corresponding to the three or more drawn figure contour points, using the drawn figure contour point information and the reference contour information, acquires ideal contour information, which is a function for acquiring the distances based on path lengths from a given point on the reference contour to the corresponding points, and is a function indicating an ideal contour that is a curve that approximates the distances, and acquires ideal contour information by repeating once or more processing for deleting any drawn figure contour point whose distance from the ideal contour indicated by the ideal contour information is large enough to meet a predetermined condition and processing for acquiring the ideal contour information using distances between three or more drawn figure contour points after the deletion and corresponding points respectively corresponding to the three or more drawn figure contour points;

acquiring distances from target points, which are three or more points at a given path length from a given point on the reference contour, to points on the ideal contour respectively corresponding to the target points, using the reference contour information and the ideal contour information, acquires points at the acquired distances respectively from the target points, and acquires ideal contour point information, which is information indicating three or more ideal contour points that are the acquired points; and outputting the ideal contour point information.

15. The non-transitory storage medium according to claim 14, wherein:

the drawn figure contour point information is actually observed contour point information, which is information acquired using an image obtained by capturing an image of a figure drawn according to the pattern figure by the electron beam writer, and indicating three or more actually observed contour points that are points on an actually observed contour that is a contour of the figure, the program, when executed by a computer, further causes the computer to perform:
- acquiring points on a coordinate system of the reference contour corresponding to the three or more actually observed contour points, and acquires corrected contour point information, which is information indicating three or more corrected contour points that are the acquired points; and
- acquiring the ideal contour information, using the reference contour information and the corrected contour point information.

* * * * *